(12) United States Patent
Izawa et al.

(10) Patent No.: US 9,725,648 B2
(45) Date of Patent: Aug. 8, 2017

(54) PHOSPHOR AND LIGHT-EMITTING DEVICE INCLUDING THE SAME

(71) Applicant: SAMSUNG ELECTRONICS CO., LTD., Suwon-si, Gyeonggi-do (KR)

(72) Inventors: Takamasa Izawa, Kanagawa (JP); Dohoon Kim, Kanagawa (JP); Masahiko Yoshino, Kanagawa (JP); Takatoshi Seto, Kanagawa (JP)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 191 days.

(21) Appl. No.: 14/566,614

(22) Filed: Dec. 10, 2014

(65) Prior Publication Data

US 2015/0159085 A1 Jun. 11, 2015

(30) Foreign Application Priority Data

Dec. 10, 2013 (JP) .................................. 2013-255073
Jul. 11, 2014 (KR) ........................ 10-2014-0087319

(51) Int. Cl.
| | | |
|---|---|---|
| C09K 11/77 | (2006.01) | |
| F21K 99/00 | (2016.01) | |
| H01L 33/50 | (2010.01) | |
| H01L 33/56 | (2010.01) | |
| C09K 11/08 | (2006.01) | |
| F21S 8/10 | (2006.01) | |
| F21K 9/23 | (2016.01) | |
| F21Y 115/10 | (2016.01) | |

(52) U.S. Cl.
CPC ...... *C09K 11/7792* (2013.01); *C09K 11/0883* (2013.01); *F21S 48/1131* (2013.01); *F21S 48/1145* (2013.01); *F21S 48/1159* (2013.01); *H01L 33/502* (2013.01); *H01L 33/504* (2013.01); *F21K 9/23* (2016.08); *F21Y 2115/10* (2016.08); *H01L 2224/48247* (2013.01); *H01L 2224/48465* (2013.01); *H01L 2224/8592* (2013.01); *H01L 2924/181* (2013.01)

(58) Field of Classification Search
CPC ............ C09K 11/7792; C09K 11/7734; H01L 33/504; H01L 33/56; H01L 33/507; F21K 9/56; F21K 9/232; F21K 9/64; F21S 48/00-48/34; F21S 48/115; F21S 48/1131; G02F 2001/133614; G02B 6/00
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,611,641 B2 | 11/2009 | Schmidt et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,133,461 B2 | 3/2012 | Tao et al. |
| 8,179,938 B2 | 5/2012 | Kim |
| 8,263,987 B2 | 9/2012 | Choi et al. |
| 8,324,646 B2 | 12/2012 | Lee et al. |
| 8,398,890 B2 | 3/2013 | Seto et al. |
| 8,399,944 B2 | 3/2013 | Kwak et al. |

(Continued)

FOREIGN PATENT DOCUMENTS

| | | | |
|---|---|---|---|
| JP | 2006-199755 A | 8/2006 | |
| JP | 2008-266410 A | 11/2008 | |
| JP | 2009-173905 A | 8/2009 | |
| JP | 2009-203466 A | 9/2009 | |
| JP | 2010-507008 | 3/2010 | |

(Continued)

OTHER PUBLICATIONS

Woon Bae Park et al., JSS Special Issue on Luminescent Materials for Solid State Lighting, "A Yellow-Emitting Oxynitride Phosphor: Ce4-xCAxSi12O3+xN18-x:Eu2+", ECS Journal of Solid State Science and Technology, 2(2) R3100-R3106 (2013).

*Primary Examiner* — Carol M Koslow

(74) *Attorney, Agent, or Firm* — Muir Patent Law, PLLC

(57) ABSTRACT

A yellow phosphor is provided. The yellow phosphor includes a crystal formed of a compound that is represented by the following formula (1): $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$ (1), wherein Ln includes at least one rare earth element, and M includes at least one selected from calcium (Ca), barium (Ba), strontium (Sr), and magnesium (Mg).

19 Claims, 22 Drawing Sheets

(56) References Cited

U.S. PATENT DOCUMENTS

| | | |
|---|---|---|
| 8,432,511 B2 | 4/2013 | Jeong |
| 8,459,832 B2 | 6/2013 | Kim |
| 8,475,683 B2 | 7/2013 | Li et al. |
| 8,502,242 B2 | 8/2013 | Kim |
| 8,529,791 B2 | 9/2013 | Wu et al. |
| 8,536,604 B2 | 9/2013 | Kwak et al. |
| 8,574,459 B2 | 11/2013 | Seto et al. |
| 8,735,931 B2 | 5/2014 | Han et al. |
| 8,766,295 B2 | 7/2014 | Kim |
| 8,828,272 B2 | 9/2014 | Seto et al. |
| 8,877,094 B2 | 11/2014 | Li et al. |
| 9,337,391 B2 * | 5/2016 | Jean ............... H01L 33/325 |
| 2013/0181164 A1 | 7/2013 | Sohn et al. |
| 2013/0234588 A1 | 9/2013 | Seto et al. |
| 2014/0158935 A1 | 6/2014 | Wu et al. |

FOREIGN PATENT DOCUMENTS

| | | |
|---|---|---|
| JP | 2010-095728 A | 4/2010 |
| JP | 4908071 B2 | 4/2012 |
| JP | 4976857 B2 | 7/2012 |
| JP | 5389333 B2 | 1/2014 |
| KR | 10-1215300 B1 | 12/2012 |
| WO | 2005/083037 A1 | 9/2005 |
| WO | WO2010/114061 | 10/2010 |
| WO | 2012/134043 A2 | 10/2012 |
| WO | WO2012/134043 | 11/2012 |

\* cited by examiner

PHOSPHOR AND LIGHT-EMITTING DEVICE INCLUDING THE SAME

CROSS-REFERENCE TO RELATED APPLICATIONS

This application claims the benefit of Korean Patent Application No. 10-2014-0087319, filed on Jul. 11, 2014, in the Korean Intellectual Property Office, and Japanese Patent Application No. 2013-255073, filed on Dec. 10, 2013, in the Japanese Intellectual Property Office, the disclosures of which are incorporated herein in their entireties by reference.

BACKGROUND

The inventive concept relates to a phosphor and an electronic device including the phosphor, and more particularly, to a yellow phosphor emitting light by using a blue light as an excitation source and a light-emitting device including the yellow phosphor.

Lighting using light-emitting diodes (LEDs) presents several advantages, such as energy saving, long lifespan, and the like. As a result, LED-based lighting is gaining widespread use in a variety of different fields, such as lamps for street lights or cars.

A combination of an LED and a yellow phosphor is generally used for providing lighting using LEDs. The yellow phosphor emits yellow light by using light emitted from the LED as an excitation source. A desired lighting color is generated by mixing yellow derived from the yellow phosphor and a color of light emitted from the LED. For example, when a blue LED and a yellow phosphor are combined with each other, blue and yellow which complement each other are mixed, and thus, pseudo-white light is obtained.

Examples of the yellow phosphor that is used in combination with the blue LED include a sialon-based phosphor or an yttrium aluminum garnet-based phosphor $(Y, Gd)_3(Al, Ga)_5O_{12}$:Ce (i.e., YAG:Ce-based phosphor) activated with cerium (Ce) (refer to Patent reference 1). Optical characteristics of the yellow phosphor, such as a light-emitting spectrum distribution and the like, are satisfactory. Particularly, the YAG:Ce-based phosphor is excellent in that pseudo-white light having a color rendering property is obtained therefrom. Examples of prior arts related to the phosphor according to the inventive concept include Patent references 2 through 6.

Furthermore, a phosphor (a representative example: $La_{4-\alpha}Ca_\alpha Si_{12}O_{3+\alpha}N_{18-\alpha}$:Eu) that is represented by a general formula $(Ca_{1-x}, M1)_a(La_{1-y}, M2_y)_bSi_cN_dO_e$ (where 1≤a≤30, 0.3a≤b≤1.7a, 1.5(a+b)≤c≤3(a+b), 1.2c≤d≤1.5c, 0.8(a+1.5b)≤e≤1.2(a+1.5b), 0≤x≤0.5, 0≤y≤0.5, M1 is at least one selected from Ba, Mg, Sr, Mn, and Zn, and M2 is at least one selected from Y, Lu, Sc, Gd, Tb, and Ce) has been reported (refer to References 7 and 8).

PATENT REFERENCES

1. Japanese Patent Application Pub. No. 2010-507008
2. Japanese Patent Application Pub. No. 2008-222878
3. Japanese Patent Application Pub. No. 2006-199755
4. Japanese Patent Application Pub. No. 2007-332217
5. Japanese Patent Application Pub. No. 2007-526635
6. US Patent Application No. 2012/8133461
7. Korean Patent Application Pub. No. 10-2012-0110216

NON-PATENT REFERENCE

8. W. B. Park, Y. S. Jeong, S. P. Singh, K. S. Sohn, ECS J. Solid-state sci. 2(2) R3100-R3106(2013).

As disclosed in Patent reference 1, the YAG:Ce-based phosphor is mainly used as a yellow phosphor for LEDs. However, the YAG:Ce-based phosphor has a wavelength in a light-emitting region, which deviates from a spectral luminous efficacy curve having a peak of about 555 nm due to a wide yellow light emission peak, and thus, light emission that is not visible by human eyes exists although quantum efficiency may be increased by increasing crystallizability. Accordingly, the YAG:Ce-based phosphor is not a phosphor providing an ultra-high brightness, and the purity of yellow of light emitted from the YAG:Ce-based phosphor is relatively low. An $La_{4-\alpha}Ca_\alpha Si_{12}O_{3+\alpha}N_{18-\alpha}$:Eu phosphor disclosed in Patent reference 7 and Non-patent reference 1 has a half-width of a yellow light emission peak which is about 72 nm to about 80 nm and is remarkably narrow compared to a half-width (about 115 nm) of the YAG:Ce-based phosphor, and thus allows emission of yellow light emission having a very high spectral luminous efficacy efficiency. Thus, the $La_{4-\alpha}Ca_\alpha Si_{12}O_{3+\alpha}N_{18-\alpha}$:Eu phosphor may provide initial characteristics of ultra-high brightness and a relatively high purity of yellow. However, since another crystal phase is incidentally generated during the composition of the $La_{4-\alpha}Ca_\alpha Si_{12}O_{3+\alpha}N_{18-\alpha}$:Eu phosphor, the crystallizability and light emission intensity thereof may not be increased.

SUMMARY

The inventive concept provides a yellow phosphor that remarkably improves a spectral luminous efficacy efficiency compared to the YAG:Ce-based phosphor, has a narrow yellow light emission peak width to provide a relatively high color purity, and increases light emission intensity without inducing an incidental phase during composition.

According to an aspect of the inventive concept, there is provided a yellow phosphor including a crystal formed of a compound that is represented by the following formula (1):

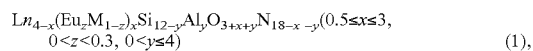

$$Ln_{4-x}(Eu_zM_{1-z})_xSi_{12-y}Al_yO_{3+x+y}N_{18-x-y} (0.5 \le x \le 3, 0 < z < 0.3, 0 < y \le 4) \quad (1),$$

wherein Ln includes at least one rare earth element, and M includes at least one selected from calcium (Ca), barium (Ba), strontium (Sr), and magnesium (Mg).

Ln may include at least one selected from lanthanum (La) and Cerium (Ce).

M may include at least calcium (Ca).

The crystal may be monoclinic and may have a crystal structure of a space group C2.

Ln may include a combination in which at least 70 mol % of a total amount of Ln includes Ce and La and a remainder of the total amount of Ln includes at least one selected from lutetium (Lu), scandium (Sc), gadolinium (Gd), and yttrium (Y).

Ln may include at least one selected from La and Ce, and Ln may further include at least one selected from a praseodymium ion ($Pr^{3+}$) and a terbium ion ($Tb^{3+}$).

Ln may include at least one selected from La and Ce, and Ln may further include at least one selected from neodymium (Nd), promethium (Pm), samarium (Sm), dysprosium (Dy), holmium (Ho), erbium (Er), thulium (Tm), and ytterbium (Yb).

M may include a combination in which at least 90 mol % of a total amount of M includes Ca and a remainder of the total amount of M includes at least one selected from Sr, Ba, and Mg.

A mole ratio of europium (Eu) to (Eu+M) may be equal to or greater than 0.01 and be less than 0.3.

The crystal may be in a powder state.

According to an aspect of the inventive concept, there is provided a light-emitting device including: a light-emitting diode (LED) chip; a resin covering at least a portion of the LED chip; and a yellow phosphor dispersed in the resin, wherein the yellow phosphor includes a crystal formed of a compound that is represented by the following formula (1):

$$Ln_{4-x}(Eu_zM_{1-z})_xSi_{12-y}Al_yO_{3+x+y}N_{18-x+y} (0.5 \leq x \leq 3, 0 < z < 0.3, 0 < y \leq 4) \quad (1),$$

wherein Ln includes at least one rare earth element, and M includes at least one selected from calcium (Ca), barium (Ba), strontium (Sr), and magnesium (Mg).

The yellow phosphor may be in a powder state of which an average diameter is from about 1 μm to about 15 μm.

Ln may include at least one selected from lanthanum (La) and Cerium (Ce).

M may include calcium (Ca).

The crystal may be monoclinic and may have a crystal structure of a space group C2.

According to an aspect of the inventive concept, there is provided a light-emitting device having a structure obtained by combining the yellow phosphor described above, a red phosphor, and a blue light-emitting diode (LED).

The red phosphor may include at least one selected from $CaAlSiN_3:Eu$, $Sr_2Si_5N_8:Eu$, $SrSiAl_4N_7:Eu$, $SrLiAl_3N_4:Eu$, and $K_2SiF_6:Mn^{4+}$.

The light-emitting device may be configured to emit light of which (x, y) coordinates of the CIE 1931 colorimetric system are positioned on a line segment, which connects (0.4476, 0.4074), (0.3484, 0.3516), (0.3101, 0.3162), (0.3128, 0.3292), and (0.3333, 0.3333), or in an area surrounded by the line segment and a black-body radiation spectrum.

The light-emitting device may be configured to emit light having a color temperature is between 2,000K and 20,000K.

According to an aspect of the inventive concept, there is provided a lighting unit including a lighting unit body having an opening; a light-emitting diode (LED) disposed within the lighting unit body; and a light transmitting member disposed in a path of light emission from the LED through the opening and including a yellow phosphor, wherein the yellow phosphor comprises a crystal formed of a compound that is represented by the following formula (1):

$$Ln_{4-x}(Eu_zM_{1-z})_xSi_{12-y}Al_yO_{3+x+y}N_{18-x+y} (0.5 \leq x \leq 3, 0 < z < 0.3, 0 < y \leq 4) \quad (1),$$

wherein Ln comprises at least one rare earth element, and M comprises at least one selected from calcium (Ca), barium (Ba), strontium (Sr), and magnesium (Mg).

The lighting unit body may include a reflective cup having the LED disposed therein, a resin packaging unit encapsulating the LED in the reflective cup, and the yellow phosphor disposed on or in the resin packaging unit encapsulating the LED.

The lighting unit may be one of a bulb-type lamp including a socket structure, a rectification circuit, and a phosphor disposed on the LED; a headlamp in which the light transmitting member is a phosphor disposed on the LED; and a backlight unit in which the light transmitting member is a phosphor disposed on the LED.

The lighting unit may be a backlight unit in which the light transmitting member is one of a phosphorescent film disposed on a bottom case of the backlight unit, a phosphorescent film disposed between the LED and a light guiding plate of the backlight unit, and a phosphorescent film disposed on a light-emitting surface of a light guiding panel of the backlight unit.

According to an aspect of the inventive concept, there is provided a light-emitting device including a unit, wherein the unit include: a semiconductor diode emitting light belonging to at least one selected from a near ultraviolet region, an ultraviolet region, and a blue region; and a yellow phosphor disposed on an optical path of the semiconductor diode to emit light when the light emitted from the semiconductor diode is radiated on the yellow phosphor, wherein the yellow phosphor includes a crystal formed of a compound that is represented by the following formula (1):

$$Ln_{4-x}(Eu_zM_{1-z})_xSi_{12-y}Al_yO_{3+x+y}N_{18-x+y} (0.5 \leq x \leq 3, 0 < z < 0.3, 0 < y \leq 4) \quad (1),$$

where Ln includes at least one rare earth element, and M includes at least one selected from calcium (Ca), barium (Ba), strontium (Sr), and magnesium (Mg).

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
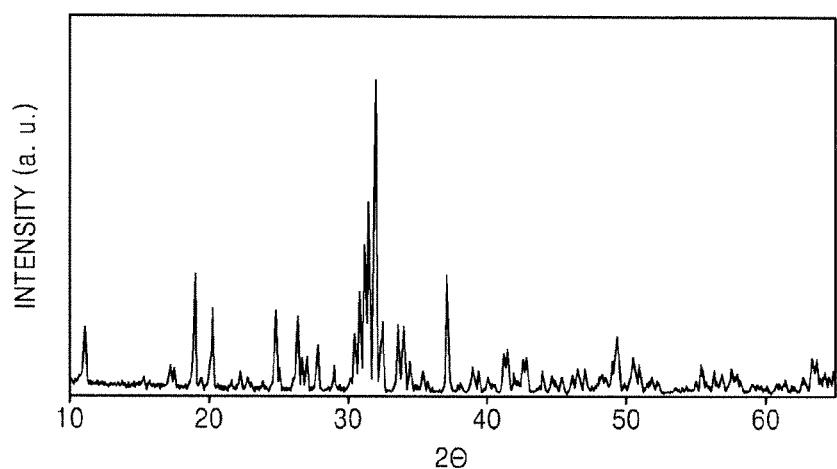
FIG. 1 is a diagram illustrating an X-ray diffraction (XRD) pattern of a crystal in which x=1.5, y=0.024, z=0.05, Ln=Ce, and M=Ca in a general formula (1) $Ln_{4-x}(Eu_zM_{1-z})_xSi_{12-y}Al_yO_{3+x+y}N_{18-x+y}$, of a phosphor according to an embodiment of the inventive concept.

Hereinafter, exemplary embodiments of the inventive concept will be described in detail with reference to the accompanying drawings. Like reference numerals in the drawings denote like elements, and thus repeated redundant descriptions thereof will be omitted.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art.

It will be understood that although the terms "first", "second", etc. are used herein to describe members, regions, layers, portions, sections, components, and/or elements in embodiments of the inventive concept, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concept. For example, a first element may also be referred to as a second element, and similarly, a second element may also be referred to as a first element, without departing from the scope of the inventive concept.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the embodiments of the inventive concept should not be construed as being limited to the particular shapes of regions illustrated herein but may be to include deviations in shapes that result, for example, from variations in a manufacturing process. As used herein, the term "and/or" includes any and all combinations of one or more of the associated listed items.

A yellow phosphor according to an embodiment of the inventive concept, which is excited by blue light, includes a composition that is represented by a formula

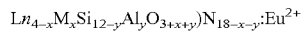

$Ln_{4-x}M_xSi_{12-y}Al_yO_{3+x+y}N_{18-x-y}:Eu^{2+}$ where M is an alkaline earth metal element and Ln is a rare earth element. Here. 'Al' denotes aluminum, 'Si' denotes silicon, 'O' denotes 'oxygen', 'N' denotes nitrogen, and 'Eu' denotes europium.

In some embodiments, the element Ln includes at least one rare earth element. In view of brightness, crystallizability, and device characteristics, the element Ln may include at least one selected from the group of cerium (Ce), lanthanum (La), lutetium (Lu), scandium (Sc), gadolinium (Gd), and yttrium (Y). For example, the element Ln may include at least one selected from the group of Ce and La.

In a lighting device obtained by combining a blue light-emitting diode (LED) with a phosphor having a composition that is represented by a formula (1) $Ln_{4-x}(Eu_zM_{1-z})_xSi_{12-y}Al_yO_{3+x+y}N_{18-x-y}$, the element Ln may include Ce. When the element Ln is formed by a combination, the element Ln may be formed of a combination in which the sum of Ce and La occupies about 70 mol % or more of the total amount of Ln and the sum of Lu, Sc, Gd, and Y occupies about 0 mol % to about 30 mol % of the total amount of Ln. For example, the element Ln may be formed of a combination in which the sum of Ce and La occupies about 90 mol % or more, Ce/(Ce+La) occupies about 10 mol % or more, and the sum of Lu, Sc, Gd, and Y occupies about 0 mol % to about 10 mol %. In another example, the element Ln may be formed of a combination in which the sum of Ce and La occupies about 100 mol % and Ce/(Ce+La) occupies about 10 mol % or more. Since a praseodymium ion ($Pr^{3+}$), a terbium ion ($Tb^{3+}$) or the like may cause an increase and decrease effect for the activation of Eu2+, $Pr^{3+}$, $Tb^{3+}$, or the like may be included in the element Lu. In addition, promethium (Pm), samarium (Sm), dysprosium (Dy), holmium (Ho), erbium (Er), thulium (Tm), or ytterbium (Yb) may be included in the element Ln. In this case, Nd, Pm, Sm, Dy, Ho, Er, Tm, or Yb may be included in the element Ln to occupy about 5 mol % or less, which does not damage light emission intensity.

The element M may be formed as follows in view of brightness and crystallizability. The element M may be formed of calcium (Cu), strontium (Sr), barium (Ba), or magnesium (Mg). For, example, the element M may be formed of Ca or Sr. When the element M is formed of a combination, Ca may occupy about 90 mol % or more and Sr, Ba, and Mg may occupy about 0 mol % to about 10 mol %. In addition, since a manganese ion ($Mn^{2+}$), a ytterbium ion ($Yb^{2-}$), or the like may cause an increase and decrease effect for the activation of $Eu^{2+}$, $Mn^{2+}$, $Yb^{2+}$, or the like may be included in the element M.

$Eu^{2+}$ may be used as an activation component. With respect to the content of $E^{2+}$, a mole ratio z of Eu to (Eu+M) may be less than 0.3. For example, the mole ratio z may be less than 0.2. In another example, the mole ratio z may be less than 0.1. In another example, the mole ratio z may be 0.01 or more. In another example, the mole ratio z may be 0.02 or more. By adjusting the addition of an activation component, a light emission spectrum may be adjusted within a wavelength region as described above. When the content of the activation component is too low, an insufficient activation occurs and thus a light emission peak is undesirably reduced. When the content of the activation component is too high, the light emission spectrum may be small due to concentration quenching in which fluorescence intensity is reduced due to the high concentration. Since $Eu^{3+}$ may damage yellow brightness, it is desirable that the content of $Eu^{3+}$ is relatively low. The ratio of $Eu^{3+}$ to ($Eu^{2+}+Eu^{3+}$) may be 0.2 or less. For example, the ratio of $Eu^{3+}$ to ($Eu^{2+}+Eu^{3+}$) may be 0.1 or less. In another example, the ratio of $Eu^{3+}$ to ($Eu^{2+}+Eu^{3+}$) may be 0.

When the number of moles of Ln is 4−x and the number of moles of (Eu+M) is x, the value of x may be 0.5 or more in view of brightness. For example, the value of x may be 0.8 or more. In another example, the value of x may be 1.1 or more. In another example, the value of x may be 3 or less. In another example, the value of x may be 2.1 or less. In another example, the value of x may be 1.9 or less.

The number y of substitution moles of Al for 12 moles of Si may exceed 0.005 in view of brightness and a decrease of a phase that is incidentally generated. For example, y may exceed 0.01. In another example, y may be less than 0.3. In another example, y may be less than 0.2. In another example, y may be less than 0.15.

It is desirable that there is no defect. However, since a small amount of defects does not have an adverse influence on brightness, a negative ion defect and/or a positive ion defect may be permissible within about 5 mol %. In this case, each of numbers 4, 12, 3, and 18 in the general formula (1): $Ln_{4-x}(Eu_zM_{1-z})_xSi_{12-y}Al_yO_{3+x+y}N_{18-x-y}$, may be fluctuated in a range within about +/−5%.

The yellow phosphor according to an embodiment of the inventive concept may have a monoclinic (C2)-type crystal structure after firing, and may have another crystal phase if effects of the inventive concept are not damaged. The yellow phosphor according to an embodiment of the inventive concept may include at least about 50 mol % of a crystal that is represented by the general formula (1).

Figure 2:
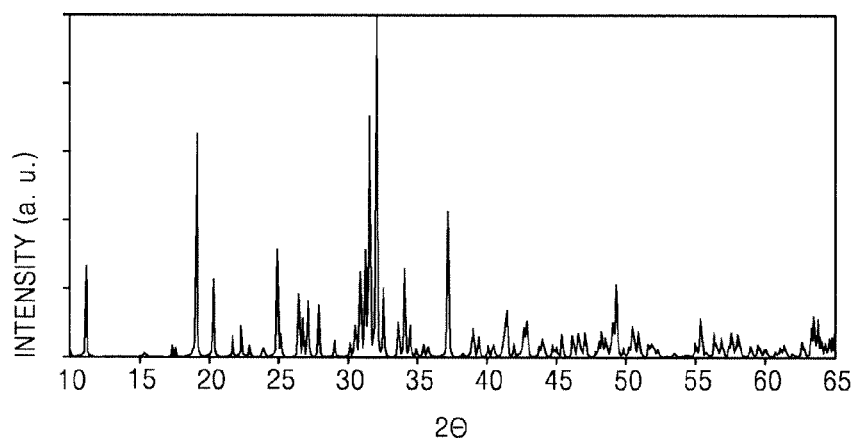
FIG. 2 is a diagram illustrating a simulation pattern of $Ca_{1.4}Ce_{2.6}Si_{12}O_{4.4}N_{16.6}$ having a monoclinic and space group C2 structure, made from information of Table II of Non-patent reference 1.

The monoclinic (C2)-type crystal structure of the yellow phosphor according to an embodiment of the inventive concept is described by using an X-ray diffraction (XRD) pattern illustrated in FIG. I. FIG. 1 illustrates an XRD pattern of a crystal in which x=1.5, y=0.024, z=0.05, Ln=Ce, and M=Ca in the general formula (1). FIG. 2 illustrates a simulation pattern of $Ca_{1.4}Ce_{2.6}Si_{12}O_{4.4}N_{16.6}$ having a monoclinic and space group C2 structure, made from information of Table II of Non-patent reference 1. The simulation pattern of FIG. 2 coincides with the XRD pattern of the yellow phosphor according to an embodiment of the inventive concept.

In the yellow phosphor according to an embodiment of the inventive concept, 2θ in a profile of an XRD pattern of a Cu Kα source has a peak around 32°, as shown in FIG. 1. In addition, 2θ has peaks also around 19° and 37.2°.

A method of manufacturing the yellow phosphor is not particularly limited to any method. However, the yellow phosphor may be manufactured by using a method such as a solid state reaction method. An example is described below.

First, a mixture is obtained by grinding and mixing raw material compounds of the yellow phosphor. The raw material compounds are selected from oxides, precursors, and nitrides of required elements. For example, a raw material of the element Ln may be selected from $Y_2O_3$, YN, $La_2O_3$, LaN, $Gd_2O_3$, GdN, $Lu_2O_3$, LuN, $CeO_2$, and CeN, and carbonate or oxalate may be used as a precursor. $Ca_3N_2$, $Ca_3CO_2$, CaO, $Sr_3N_2$, $Sr_3CO_2$, or SrO may be used as the alkaline earth metal element M. AlN or $Al_2O_3$ may be used as a raw material of Al. $Si_3N_4$, $SiO_2$, or $Si_2N_2O$ may be used as a raw material of Si. $Eu_2O_3$ or EuN may be used as an activation component. In addition, a fluoride, such as $CeF_3$, $AlF_3$, $CaF_2$, $SrF_2$, $BaF_2$, $MgF_2$, $YF_3$, $LaF_3$, $EuF_3$, $GdF_3$, $ScF_3$, or $LuF_3$, may be included in the raw materials to obtain a flux effect. In some embodiments, a triadic fluoride that is selected from the materials stated above may be used as the fluoride.

The mixture of the raw materials is filled, with a filling factor of about 20% to about 50%, in a holding vessel for sintering and is treated and reacted by using heat in an inert atmosphere of nitrogen or in a reducing gas including hydrogen of 5% or less. A heat treatment temperature may be from about 1350° C. (degrees Celsius) to about 1900° C. In some embodiments, the heat treatment temperature may be from about 1450° C. to about 1750° C. The heat treatment temperature may be maintained for about 2 hours to about 24 hours. A firing atmosphere may be used as a pressure condition, and a phosphor on which firing has been performed once may be grinded and then fired again. To improve the reduction effect of the raw materials, a carbon may be added to the raw materials in a firing atmosphere, before mixing the raw materials, or after mixing the raw materials.

According to an embodiment of the inventive concept, a small amount of impurities may be allowably included in the phosphor as long as effects of an embodiment may be obtained. However, the content of the impurities is limited to a very small amount.

An obtained yellow phosphor may be grinded in a powder state, and the yellow phosphor grinded in the powder state may be mixed with a resin or a liquid to form a mixture. In this case, an average diameter of yellow phosphor powders may be from about 1 μm to about 15 μm in view of dispersibility and handling.

A method of manufacturing an LED package in which the yellow phosphor according to an embodiment of the inventive concept is used is described below.

First, an encapsulant is made by mixing a fine-grained yellow phosphor with a thermosetting resin, such as a silicon resin or an epoxy resin, until the fine-grained yellow phosphor is homogeneously dispersed. A dispersant may be added while making the encapsulant.

The encapsulant including the fine-grained yellow phosphor is injected into an LED package, mounted with a blue LED device by wire bonding, to encapsulate the blue LED device. After the blue LED device is encapsulated, the LED package is kept intact for a predetermined time so that particles of the fine-grained yellow phosphor are deposited around the LED device.

By heat-treating the LED package after sufficiently depositing the particles of the fine-grained yellow phosphor, an LED package using the yellow phosphor according to an embodiment of the inventive concept is obtained.

In the LED package using the yellow phosphor according to an embodiment of the inventive concept, an LED device emits blue light having a peak around a wavelength of 450 nm when a current flows through the blue LED device. The particles of the yellow phosphor are excited by using the blue light emitted from the blue LED device as an excitation source. A light emission peak appears in a wavelength area of the range of about 540 nm to about 590 nm. When a red phosphor is added to the yellow phosphor, color rendering may be improved and thus a blue color or a white color such as warm white may be obtained.

The yellow phosphor according to an embodiment of the inventive concept may be applied to a backlight source and a display paint that is excited by blue light, as well as the LED lighting. In addition, the yellow phosphor according to an embodiment of the inventive concept may be applied to a light-emitting device.

Embodiments

Exemplary embodiments of the inventive concept are described below. However, the inventive concept is not limited to these embodiments.

[Comparison example 1, Embodiment 1, and Embodiment 2]: A comparison between compositions when parameters x and z, but not y, are fixed and y is changed under a condition $0 \leq y \leq 0.12$.

Synthesized chemical compositions of yellow phosphors are shown in Table 1. With respect to the comparison example 1, the embodiment 1, and the embodiment 2, $Ca_3N_2$, $Ca_2CO_3$, LaN, $La_2O_3$, CeN, $CeO_2$, EuN, $Eu_2O_3$, $Al_2O_3$, AlN, $SiO_2$, and $Si_3N_4$ are properly combined with one another so that the compositions satisfy chemical formulas of Table 1.

TABLE 1

| | Chemical formula | x | y | z |
|---|---|---|---|---|
| Comparison 1 | $(La_{0.6}Ce_{0.4})_{2.5}(Ca_{0.95}Eu_{0.05})_{1.5}Si_{12}O_{4.5}N_{16.5}$ | 1.5 | 0 | 0.05 |
| Embodiment 1 | $(La_{0.6}Ce_{0.4})_{2.5}(Ca_{0.95}Eu_{0.05})_{1.5}Al_{0.06}Si_{11.94}O_{4.56}N_{16.44}$ | 1.5 | 0.06 | 0.05 |
| Embodiment 2 | $(La_{0.6}Ce_{0.4})_{2.5}(Ca_{0.95}Eu_{0.05})_{1.5}Al_{0.12}Si_{11.88}O_{4.62}N_{16.38}$ | 1.5 | 0.12 | 0.05 |

Each of raw material powders having compositions shown in Table 1 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of 0.92 MPa is applied into the atmosphere furnace, and then the temperature is additionally raised up to about 1700° C. for about 120 minutes. A firing temperature is about 1700° C., and a firing time is about 4 hours. A fired body obtained after a firing process is completed is pulverized by using a mortar. In this manner, the comparison example 1, the embodiment 1, and the embodiment 2, which are in phosphor powder states, are obtained.

Figure 3:
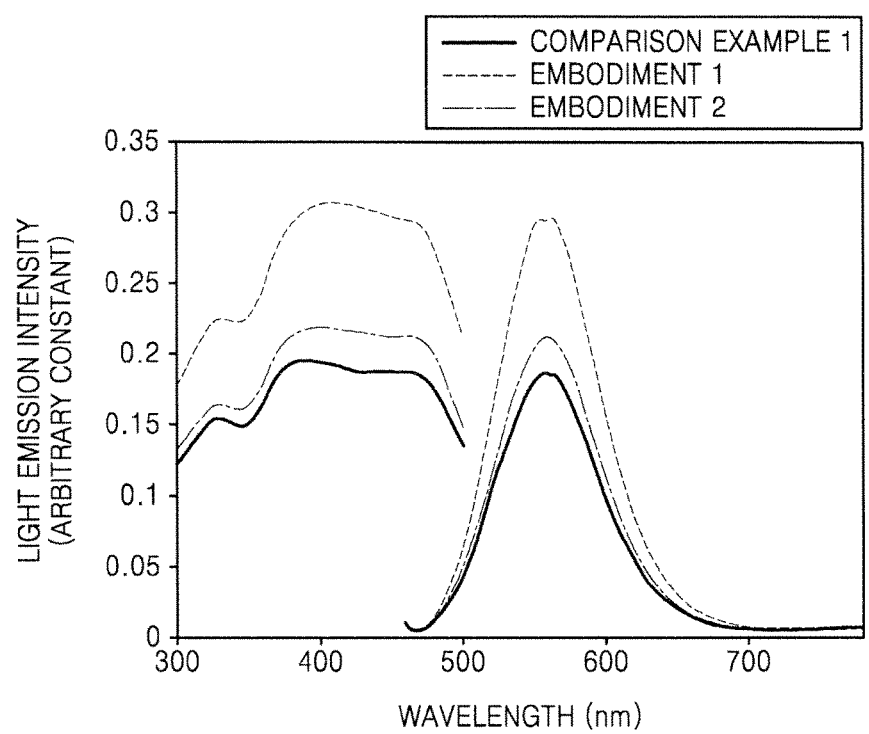
FIG. 3 is a graph illustrating an excitation spectrum for a light emission spectrum peak wavelength during a 450 nm excitation with respect to a comparison example 1, an embodiment 1, and an embodiment 2.

Excitation and light emission spectrums and chromaticity coordinates of the comparison example 1, embodiment 1, and embodiment 2 are measured at room temperature (25° C.) by using a general method. The measured excitation and light emission spectrums of the comparison example 1, embodiment 1, and embodiment 2 are shown in FIG. 3.

Figure 4:
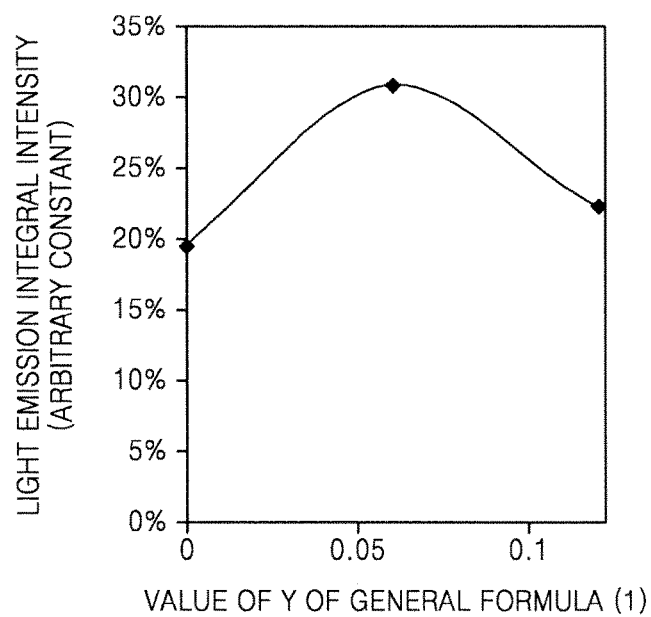
FIG. 4 is a graph illustrating light emission integral intensity for a value of y in the general formula (1) during a 450 nm excitation with respect to the comparison example 1, the embodiment 1, and the embodiment 2.

Light emission integral intensities of the comparison example 1, embodiment 1, and embodiment 2 are measured by using a general method. The measured light emission integral intensities of the comparison example 1, embodiment 1, and embodiment 2 are shown in FIG. 4. The light emission integral intensities of the comparison example 1, embodiment 1, and embodiment 2, shown in FIG. 4, are light emission integral intensities for the value of y of the general formula (1) during a 450 nm excitation.

Table 2 illustrates results obtained by measuring the light emission spectrums and chromaticity coordinates of the comparison example 1, embodiment 1, and embodiment 2. 'x' and 'y' in Table 1 are values of an XY colorimetric system (CIE 1931 colorimetric system) that is one of the CIE chromaticity coordinates. That is, 'x' and 'y' in Table 1 are different from x and y in the general formula (1) for the phosphor according to an embodiment of the inventive concept.

TABLE 2

| | Characteristics of light emission spectrum (Excitation 450 nm) | | | |
|---|---|---|---|---|
| | Light emission peak wavelength (nm) | Half-width (nm) | Chromaticity coordinates x | y |
| Comparison 1 | 550 | 82 | 0.388 | 0.583 |
| Embodiment 1 | 558 | 85 | 0.395 | 0.566 |
| Embodiment 2 | 560 | 83 | 0.399 | 0.567 |

Referring to FIGS. 3 and 4 and Table 2, it may be understood that an improvement of light emission intensity or a change in light emission characteristics occurs by adjusting the value of y in the general formula (1), that is, an introduction ratio of aluminum (Al) and oxygen (O).

[Embodiments 3 through 5]: A comparison between compositions when y is fixed to 0.06 in a composition ratio of La to Ce.

Synthesized chemical compositions of yellow phosphors are shown in Table 3. With respect to the embodiments 3 through 5, $Ca_3N_2$, $Ca_2CO_3$, LaN, $La_2O_3$, CeN, $CeO_2$, EuN, $Eu_2O_3$, $Al_2O_3$, AlN, $SiO_2$, and $Si_3N_4$ are properly combined with one another so that the compositions satisfy chemical formulas of Table 3.

TABLE 3

| | Chemical formula | x | y | z |
|---|---|---|---|---|
| Embodiment 3 | $(La)_{2.5}(Ca_{0.95}Eu_{0.05})_{1.5}Al_{0.06}Si_{11.94}O_{4.56}N_{16.44}$ | 1.5 | 0.06 | 0.05 |
| Embodiment 4 | $(La_{0.6}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 |
| Embodiment 5 | $(La_{0.6}Ce_{0.2})_{2.5}(Ca_{0.95}Eu_{0.05})_{1.5}Al_{0.06}Si_{11.94}O_{4.56}N_{16.44}$ | 1.5 | 0.12 | 0.05 |

Each of raw material powders having compositions shown in Table 3 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of 0.92 MPa is applied into the atmosphere furnace, and then the temperature is additionally raised up to about 1700° C. for about 120 minutes. A firing temperature is about 1700° C., and a firing time is about 4 hours. A fired body obtained after a firing process is completed is pulverized by using a mortar and then is fired again for about 8 hours under an atmosphere of 1650° C., nitrogen 95%, and hydrogen 5%. In this manner, the embodiments 3 through 5 which are in a phosphor powder state are obtained.

Figure 5:
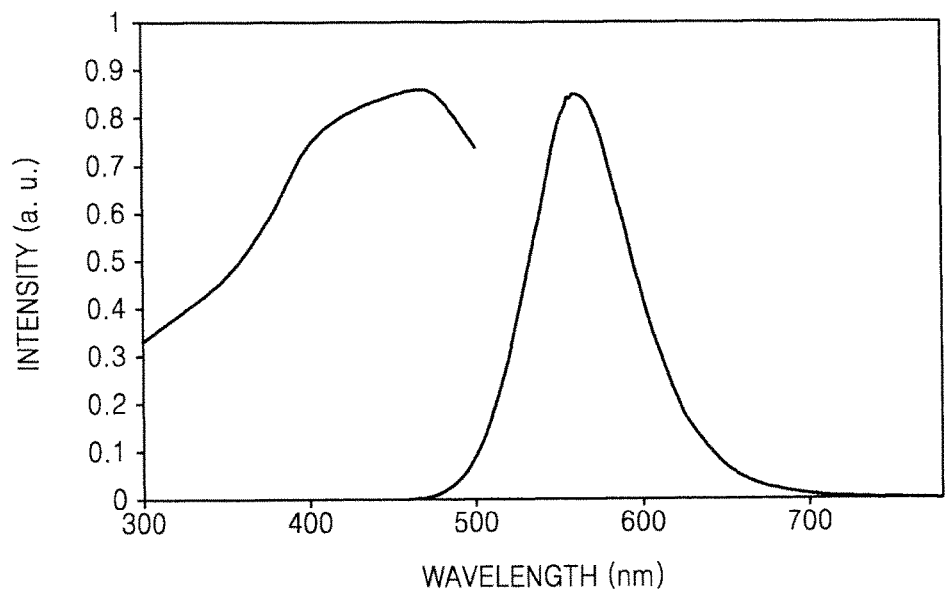
FIG. 5 is a graph illustrating an excitation spectrum for a light emission spectrum peak wavelength during u450 nm excitation with respect to an embodiment 3.
Figure 6:
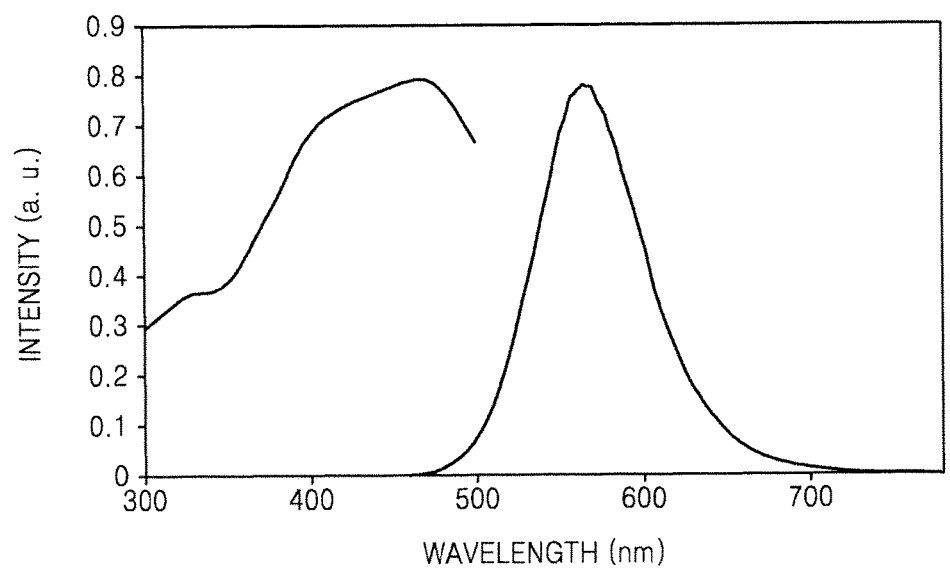
FIG. 6 is a graph illustrating an excitation spectrum for a light emission spectrum peak wavelength during a 450 nm excitation with respect to an embodiment 4.
Figure 7:
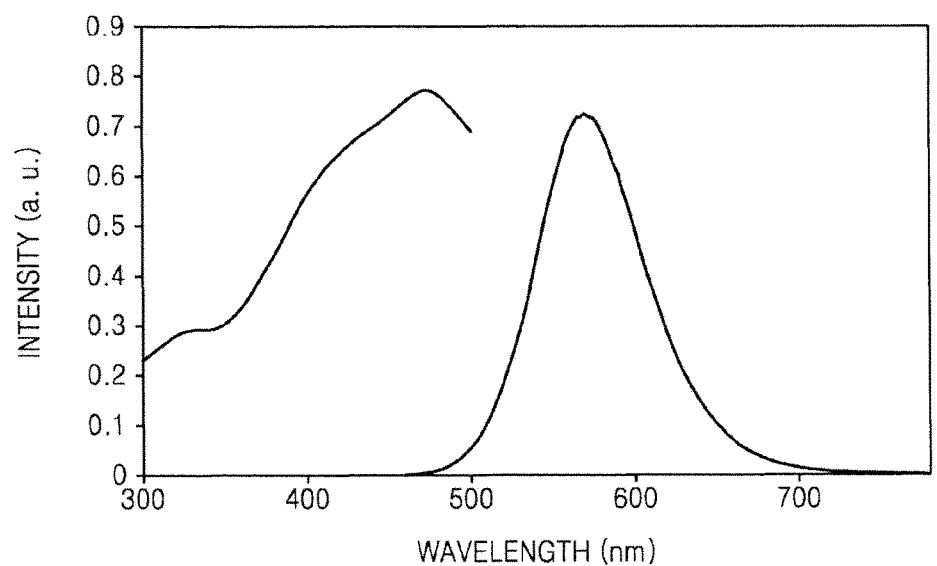
FIG. 7 is a graph illustrating an excitation spectrum for a light emission spectrum peak wavelength during a 450 nm excitation with respect to an embodiment 5.

Excitation and light emission spectrums and chromaticity coordinates of the embodiments 3 through 5 are measured at room temperature (25° C.) by using a general method. The measured excitation and light emission spectrum of the embodiment 3 is shown in FIG. 5, the measured excitation and light emission spectrum of the embodiment 4 is shown in FIG. 6, and the measured excitation and light emission spectrum of the embodiment 5 is shown in FIG. 7. The excitation and light emission spectrums of the embodiments 3 through 5 is measured by using Hitachi F7000, and the CIE chromaticity coordinates x and y are calculated based on obtained spectrum data.

Table 4 illustrates results obtained by measuring the light emission spectrums and chromaticity coordinates of the embodiments 3 through 5. 'x' and 'y' in Table 4 are values of the XY colorimetric system (CIE 1931 colorimetric system) that is one of the CIE chromaticity coordinates. That is, 'x' and 'y' in Table 4 are different from x and y in the general formula (1) for the phosphor according to an embodiment of the inventive concept.

TABLE 4

Characteristics of light emission spectrum (Excitation 450 nm)

| | Light emission peak wavelength (nm) | Half-width (nm) | Chromaticity coordinates | |
|---|---|---|---|---|
| | | | x | y |
| Embodiment 3 | 562 | 73 | 0.418 | 0.563 |
| Embodiment 4 | 565 | 76 | 0.436 | 0.548 |
| Embodiment 5 | 569 | 77 | 0.454 | 0.533 |

Referring to FIGS. 5 through 7 and Table 4, it may be understood that satisfactory light emission is obtained based on a blue excitation by determining various Ln composition ratios.

Figure 8:
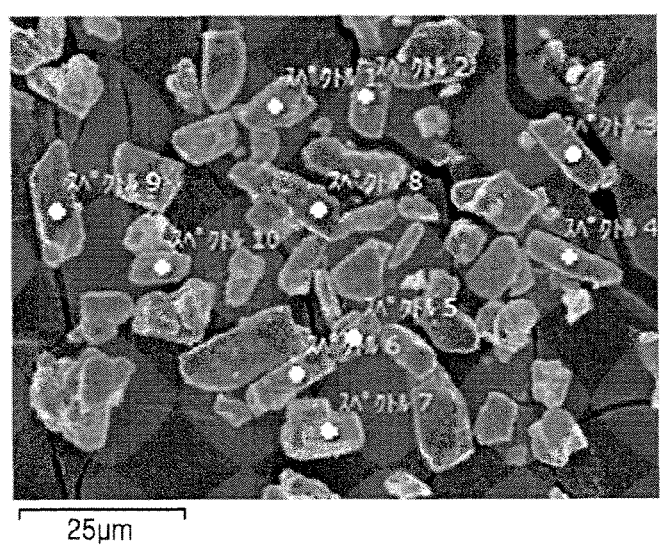
FIG. 8 is a scanning electron microscope (SEM) photo of the embodiment 4.

A scanning electron microscope (SEM) photo of the embodiment 4 is shown in FIG. 8. Energy dispersive X-ray spectroscopy (EDX) measurement results of a particle shown in the SEM photo of FIG. 8 are illustrated in Table 5. In the current embodiment, the SEM-EDX measurement is performed with an acceleration voltage 15 keV by using Hitachi SU8020. The EDX measurement results shown in Table 5 may include about 10% error due to the principle of the EDX and properties of a measured sample.

TABLE 5

| | $(Si + Al)/$ $(Ca + La + Ce + Eu)$ | $Al/$ $(Si + Al)$ | $Ce/$ $(La + Ce)$ | $(Ca + Eu)/$ $(Ca + La + Ce + Eu)$ | $(La + Ce)/$ $(Ca + La + Ce + Eu)$ |
|---|---|---|---|---|---|
| Point 1 | 271% | 0.6% | 20.8% | 33.8% | 66.3% |
| Point 2 | 302% | 0.3% | 17.8% | 36.7% | 63.3% |
| Point 3 | 251% | 1.3% | 23.6% | 26.5% | 73.5% |
| Point 4 | 304% | 0.3% | 20.4% | 37.2% | 62.8% |
| Point 5 | 280% | 0.5% | 17.5% | 39.0% | 61.0% |
| Point 6 | 287% | 0.3% | 17.8% | 36.1% | 63.9% |
| Point 7 | 318% | 0.3% | 20.3% | 25.9% | 74.1% |
| Point 8 | 275% | 0.7% | 18.7% | 36.1% | 63.9% |
| Point 9 | 260% | 0.7% | 20.6% | 31.5% | 68.5% |
| Point 10 | 247% | 0.4% | 20.1% | 37.7% | 62.3% |
| Average | 279% | 0.5% | 19.8% | 34.0% | 66.0% |

Figure 9:
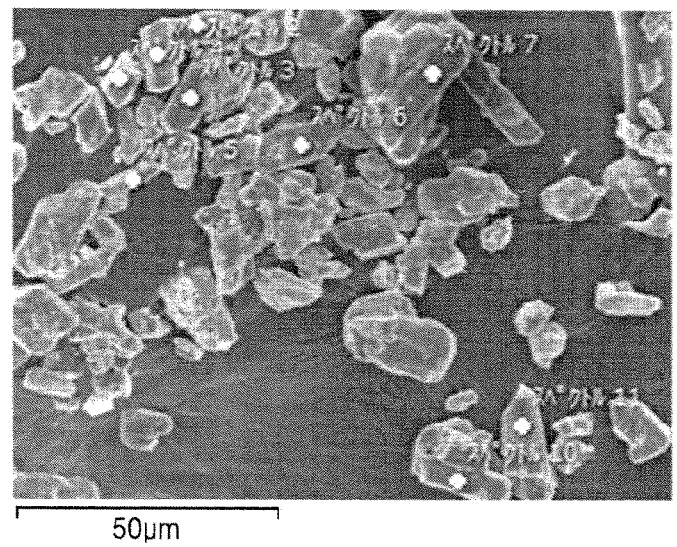
FIG. 9 is an SEM photo of the embodiment 5.

A SAM photo of the embodiment 5 is shown in FIG. 9. EDX measurement results of a particle shown in the SEM photo of FIG. 9 are illustrated in Table 6.

TABLE 6

| | $(Si + Al)/$ $(Ca + La + Ce + Eu)$ | $Al/$ $(Si + Al)$ | $Ce/$ $(La + Ce)$ | $(Ca + Eu)/$ $(Ca + La + Ce + Eu)$ | $(La + Ce)/$ $(Ca + La + Ce + Eu)$ |
|---|---|---|---|---|---|
| Point 1 | 291% | 0.70% | 40.6% | 26.3% | 73.7% |
| Point 2 | 322% | 0.40% | 38.2% | 38.2% | 61.8% |
| Point 3 | 253% | 0.60% | 42.0% | 25.7% | 74.3% |
| Point 4 | 305% | 0.60% | 43.4% | 26.1% | 73.9% |
| Point 5 | 305% | 0.40% | 40.8% | 38.3% | 61.7% |
| Point 6 | 270% | 0.50% | 39.0% | 35.6% | 64.4% |
| Point 7 | — | — | — | — | — |
| Point 8 | 294% | 0.40% | 40.5% | 37.8% | 62.2% |
| Point 9 | 312% | 0.40% | 40.9% | 38.0% | 62.0% |
| Point 10 | 302% | 0.40% | 40.7% | 35.7% | 64.3% |
| Point 11 | 272% | 0.40% | 41.7% | 35.5% | 64.5% |
| Point 12 | 253% | 0.50% | 39.5% | 35.2% | 64.8% |
| Point 13 | 292% | 0.50% | 37.6% | 36.9% | 63.1% |
| Point 14 | 271% | 0.80% | 39.6% | 26.3% | 73.7% |
| Point 15 | 330% | 0.30% | 42.4% | 27.2% | 72.8% |
| Point 16 | 334% | 0.40% | 39.4% | 28.2% | 71.8% |
| Average | 294% | 0.49% | 40.5% | 32.7% | 67.3% |

Referring to Table 5 and Table 6, it may be understood that input atoms are included in particles as they are.

[Comparison 2 and Embodiments 6 through 8]: A comparison between a composition of y=0 and compositions of 0<y≤0.096 in a composition in which Ln=Ce 100%.

Synthesized chemical compositions of yellow phosphors are shown in Table 7. With respect to the comparison example 2 and the embodiments 6 through 8, $Ca_3N_2$, $Ca_2CO_3$, LaN, $La_2O_3$, CeN, $CeO_2$, EuN, $Eu_2O_3$, $Al_2O_3$, AlN, $SiO_2$, and $Si_3N_4$ are properly combined with one another so that the compositions satisfy chemical formulas of Table 7.

TABLE 7

| | Chemical formula | x | y | z |
|---|---|---|---|---|
| Comparison 2 | $(Ce)_{2.5}(Ca_{0.95}Eu_{0.05})_{1.5}Si_{12}O_{4.5}N_{16.5}$ | 1.5 | 0 | 0.05 |
| Embodiment 6 | $(Ce)_{2.5}(Ca_{0.95}Eu_{0.05})_{1.5}Al_{0.024}Si_{11.976}O_{4.524}N_{16.476}$ | 1.5 | 0.024 | 0.05 |
| Embodiment 7 | $(Ce)_{2.5}(Ca_{0.95}Eu_{0.05})_{1.5}Al_{0.048}Si_{11.952}O_{4.548}N_{16.452}$ | 1.5 | 0.048 | 0.05 |
| Embodiment 8 | $(Ce)_{2.5}(Ca_{0.95}Eu_{0.05})_{1.5}Al_{0.096}Si_{11.904}O_{4.596}N_{16.404}$ | 1.5 | 0.096 | 0.05 |

Each of raw material powders having compositions shown in Table 7 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, an atmosphere gas including nitrogen 95% and hydrogen 5% is input to the atmosphere furnace under about 1000° C., and atmospheric pressure is applied into the atmosphere furnace, and then the temperature is additionally raised up to about 1550° C. for about 120 minutes. A firing temperature is about 1550° C., and a firing time is about 4 hours. A fired body obtained after a firing process is completed is pulverized by using a mortar and then is fired again for about 8 hours under an atmosphere of 1550° C., nitrogen 95%, and hydrogen 5%. In this manner, the comparison result 2 and the embodiments 6 through 8, which are in a phosphor powder state, are obtained.

Figure 10:
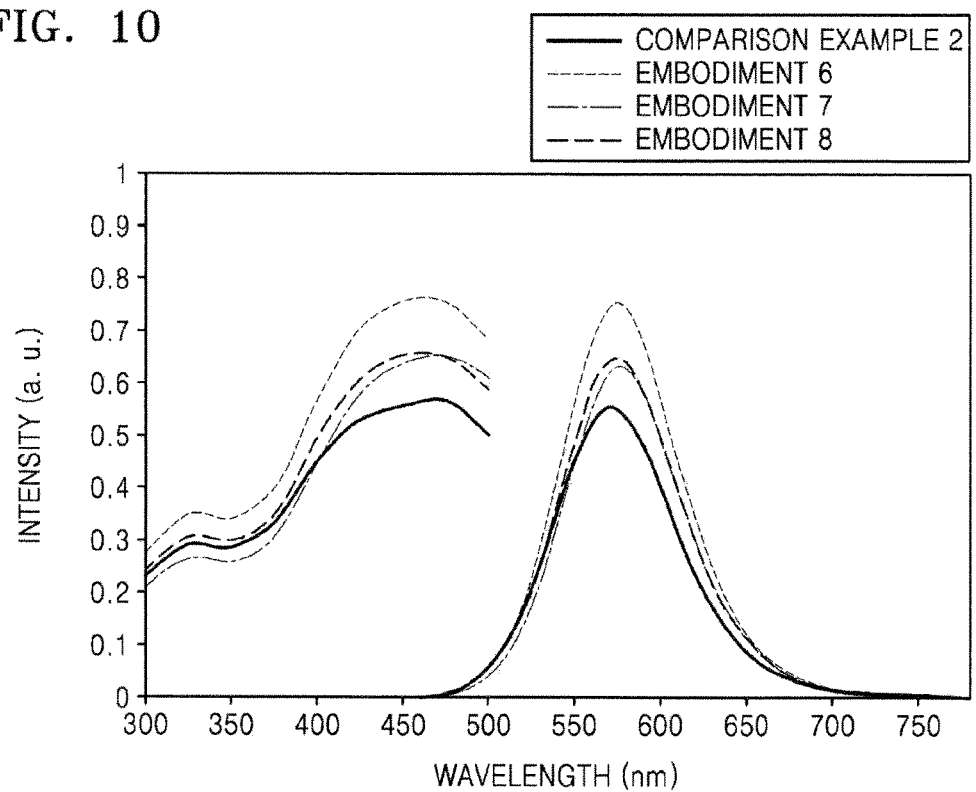
FIG. 10 is a graph illustrating an excitation spectrum for a light emission spectrum peak wavelength during a 450 nm excitation with respect to a comparison example 2 and embodiments 6 through 8.

Excitation and light emission spectrums and chromaticity coordinates of the comparison example 2 and embodiments 6 through 8 is measured at room temperature (25° C.) by using a general method. The measured excitation and light emission spectrums of the comparison example 2 and embodiments 6 through 8 are shown in FIG. 10.

Table 8 illustrates results obtained by measuring the light emission spectrums and chromaticity coordinates of the comparison example 2 and embodiments 6 through 8. 'x' and 'y' in Table 8 are values of the XY colorimetric system (CIE 1931 colorimetric system) that is one of the CIE chromaticity coordinates. That is, 'x' and 'y' in Table 8 are different from x and y in the general formula (1) for the phosphor according to an embodiment of the inventive concept.

TABLE 8

| | Characteristics of light emission spectrum (Excitation 450 nm) | | | |
|---|---|---|---|---|
| | Light emission peak wavelength (nm) | Half-width (nm) | Chromaticity coordinates | |
| | | | x | y |
| Comparison 2 | 570 | 82 | 0.453 | 0.531 |
| Embodiment 6 | 575 | 79 | 0.467 | 0.521 |
| Embodiment 7 | 572 | 81 | 0.451 | 0.533 |
| Embodiment 8 | 577 | 80 | 0.465 | 0.522 |

Referring to FIG. 10 and Table 8, it may be understood that an improvement of light emission intensity or a change in light emission characteristics occurs by adjusting the value of y in the general formula (1), that is, an introduction ratio of Al and O.

[Embodiment 7 and Embodiment 9]: A review of a flux including F atoms in a composition in which Ln=Ce (specifically, En corresponds to 100% of Ce) and y=0.048.

Synthesized chemical compositions of yellow phosphors are shown in Table 9. With respect to the embodiment 7 and the embodiment 9, $Ca_3N_2$, $Ca_2CO_3$, CeN, $CeF_3$, $CeO_2$, EuN, $Eu_2O_3$, $Al_2O_3$, AlN, $SiO_2$, and $Si_3N_4$ are properly combined with one another so that the compositions satisfy chemical formulas of Table 9.

TABLE 9

| | Chemical formula | x | y | z |
|---|---|---|---|---|
| Embodiment 7 | $(Ce)_{2.5}(Ca_{0.95}Eu_{0.05})_{1.5}Al_{0.048}Si_{11.952}O_{4.548}N_{16.452}$ | 1.5 | 0.048 | 0.05 |
| Embodiment 9 | F-contained $(Ce)_{2.5}(Ca_{0.95}Eu_{0.05})_{1.5}Al_{0.048}Si_{11.952}O_{4.548}N_{16.452}$ | 1.5 | 0.048 | 0.05 |

Each of raw material powders having compositions shown in Table 9 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, an atmosphere gas including nitrogen 95% and hydrogen 5% is input into the atmosphere furnace under about 1000° C., and an atmospheric pressure is applied into the atmosphere furnace, and then the temperature is additionally raised up to about 1550° C. for about 120 minutes. A firing temperature is about 1550° C., and a firing time is about 4 hours. A fired body obtained after a firing process is completed is pulverized by using a mortar and then is fired again for about 8 hours under an atmosphere of 1550° C., nitrogen 95%, and hydrogen 5%. In this manner, the embodiments 7 and 9 which are in a phosphor powder state are obtained. In the embodiment 9, $CeF_3$ is controlled to increase by 0.5 wt % with respect to the total weight thereof in each of first and second firings.

Figure 11:
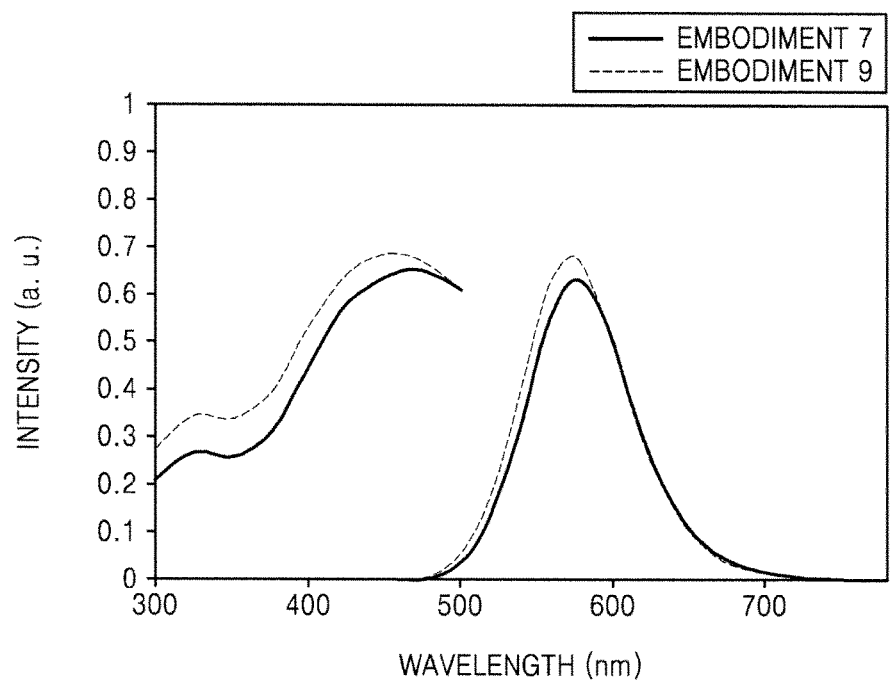
FIG. 11 is a graph illustrating an excitation spectrum for a light emission spectrum peak wavelength during a 450 nm excitation with respect to embodiments 7 and 9.

Excitation and light emission spectrums and chromaticity coordinates of the embodiments 7 and 9 are measured at room temperature (25° C.) by using a general method. The measured excitation and light emission spectrums of the embodiments 7 and 9 are shown in FIG. 11.

Table 10 illustrates results obtained by measuring the light emission spectrums and chromaticity coordinates of the embodiments 7 and 9. 'x' and 'y' in Table 10 are values of the XY colorimetric system (CIE 1931 colorimetric system) that is one of the CIE chromaticity coordinates. That is, x' and 'y' in Table 10 are different from x and y in the general formula (1) for the phosphor according to an embodiment of the inventive concept.

TABLE 10

| | Characteristics of light emission spectrum (Excitation 450 nm) | | | |
|---|---|---|---|---|
| | Light emission peak | Half-width | Chromaticity coordinates | |
| | wavelength (nm) | (nm) | x | y |
| Embodiment 7 | 572 | 81 | 0.451 | 0.533 |
| Embodiment 9 | 574 | 79 | 0.459 | 0.527 |

Referring to FIG. 11 and Table 10, it may be understood that an improvement of light emission intensity or a change in light emission characteristics occurs by a flux F.

[Comparison example 3, Comparison example 4, Embodiment 10, and Embodiment 11]: A comparison between a composition (where y=0) and a composition (where y=0.06) in a composition ratio of Ln=La, Sc, and Lu.

Synthesized chemical compositions of yellow phosphors are shown in Table 11. With respect to the comparison example 3, the comparison example 4, the embodiment 10, and the embodiment 11, $Ca_3N_2$, $Ca_2CO_3$, LaN, $La_2O_3$, ScN, $Sc_2O_3$, LuN, $Lu_2O_3$, EuN, $Eu_2O_3$, $Al_2O_3$, AlN, $SiO_2$, and $Si_3N_4$ are properly combined with one another so that the compositions satisfy chemical formulas of Table 11.

TABLE 11

| | Chemical formula | x | y | z |
|---|---|---|---|---|
| Comparison 3 | $(La_{0.9}Lu_{0.1})_{2.5}(Ca_{0.95}Eu_{0.05})_{1.5}Si_{12}O_{4.5}N_{16.5}$ | 1.5 | 0 | 0.05 |
| Embodiment 10 | $(La_{0.9}Lu_{0.1})_{2.5}(Ca_{0.95}Eu_{0.05})_{1.5}Al_{0.06}Si_{11.94}O_{4.56}N_{16.44}$ | 1.5 | 0.06 | 0.05 |
| Comparison 4 | $(La_{0.8}Sc_{0.2})_{2.5}(Ca_{0.95}Eu_{0.05})_{1.5}Si_{12}O_{4.5}N_{16.5}$ | 1.5 | 0 | 0.05 |
| Embodiment 11 | $(La_{0.8}Sc_{0.2})_{2.5}(Ca_{0.95}Eu_{0.05})_{1.5}Al_{0.06}Si_{11.94}O_{4.56}N_{16.44}$ | 1.5 | 0.06 | 0.05 |

Each of raw material powders having compositions shown in Table 11 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of about 0.92 MPa is applied into the atmosphere furnace, and then the temperature is additionally raised up to about 1700° C. for about 120 minutes. A firing temperature is about 1700° C., and a firing time is about 4 hours. A fired body obtained after a firing process is completed is pulverized by using a mortar and then is fired again for about 8 hours under an atmosphere of 1650° C., nitrogen 95%, and hydrogen 5%. In this manner, the comparison examples 3 and 4 and the embodiments 10 and 11, which are in a phosphor powder state, are obtained.

Figure 12:
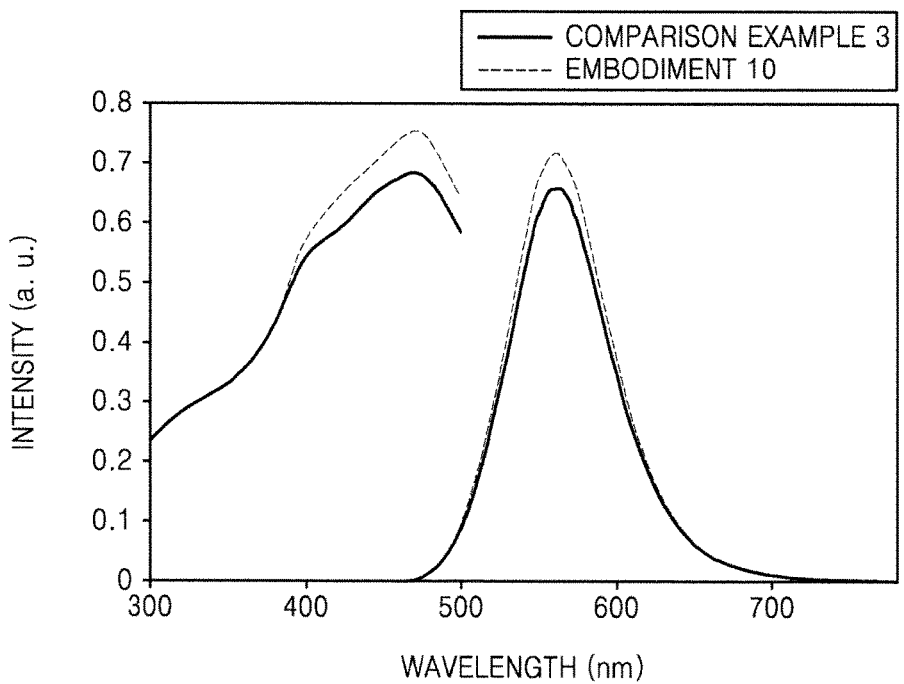
FIG. 12 is a graph illustrating an excitation spectrum for a light emission spectrum peak wavelength during a 450 nm excitation with respect to a comparison example 3 and an embodiment 10.
Figure 13:
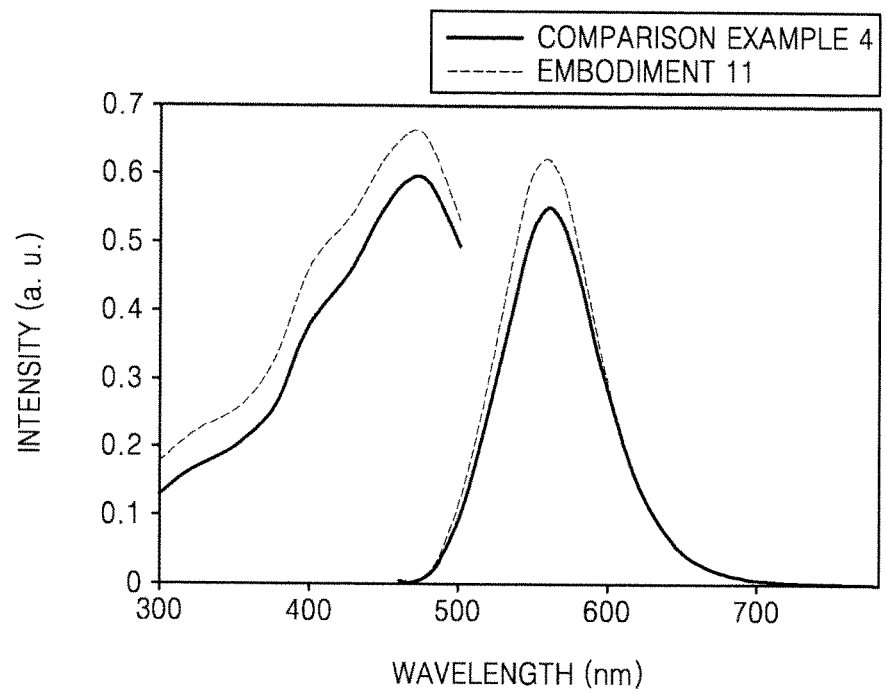
FIG. 13 is a graph illustrating an excitation spectrum for a light emission spectrum peak wavelength during a 450 nm excitation with respect to a comparison example 4 and an embodiment 11.

Excitation and light emission spectrums and chromaticity coordinates of the comparison examples 3 and 4 and embodiments 10 and 11 are measured at room temperature (25° C.) by using a general method. The measured excitation and light emission spectrums of the comparison example 3 and embodiment 10 are shown in FIG. 12. The measured excitation and light emission spectrums of the comparison example 4 and embodiment 11 are shown in FIG. 13.

Table 12 illustrates results obtained by measuring the light emission spectrums and chromaticity coordinates of the comparison examples 3 and 4 and embodiments 10 and 11. 'x' and y in Table 12 are values of the XY colorimetric system (CIE 1931 colorimetric system) that is one of the CIE chromaticity coordinates. That is, 'x' and 'y' in Table 12 are different from x and y in the general formula (1) for the phosphor according to an embodiment of the inventive concept.

TABLE 12

| | Characteristics of light emission spectrum (Excitation 450 nm) | | | |
|---|---|---|---|---|
| | Light emission peak | Half-width | Chromaticity coordinates | |
| | wavelength (nm) | (nm) | x | y |
| Comparison 3 | 563 | 76 | 0.426 | 0.562 |
| Embodiment 10 | 561 | 76 | 0.414 | 0.563 |
| Comparison 4 | 561 | 78 | 0.406 | 0.568 |
| Embodiment 11 | 558 | 76 | 0.397 | 0.574 |

Referring to FIGS. 12 and 13 and Table 12, it may be understood that an improvement of light emission intensity or a change in light emission characteristics occurs by adjusting the value of y in the general formula (1), that is, an introduction ratio of Al.

[Comparison examples 5 through 7 and Embodiments 12 through 14]:A comparison between compositions of y=0 and compositions of y=0.06 in various composition ratios of La to Ce.

Synthesized chemical compositions of yellow phosphors are shown in Table 13. With respect to the comparison examples 5 through 7 and embodiments 12 through 14, $Ca_3N_2$, $Ca_2CO_3$, LaN, $La_2O_3$, CeN, $CeO_2$, EuN, $Eu_2O_3$, $Al_2O_3$, AlN, $SiO_2$, and $Si_3N_4$ are properly combined with one another so that the compositions satisfy chemical formulas of Table 13.

TABLE 13

|  | Chemical formula | x | Y | z |
|---|---|---|---|---|
| Comparison 5 | $(La_{0.8}Ce_{0.2})_{2.5}(Ca_{0.95}Eu_{0.05})_{1.5}Si_{12}O_{4.5}N_{16.5}$ | 1.5 | 0 | 0.05 |
| Embodiment 12 | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 |
| Comparison 6 | $(La_{0.6}Ce_{0.4})_{2.5}(Ca_{0.95}Eu_{0.05})_{1.5}Si_{12}O_{4.5}N_{16.5}$ | 1.5 | 0 | 0.05 |
| Embodiment 13 | $(La_{0.6}Ce_{0.4})_{2.5}(Ca_{0.95}Eu_{0.05})_{1.5}Al_{0.06}Si_{11.94}O_{4.56}N_{16.44}$ | 1.5 | 0.06 | 0.05 |
| Comparison 7 | $(La_{0.4}Ce_{0.6})_{2.5}(Ca_{0.95}Eu_{0.05})_{1.5}Si_{12}O_{4.5}N_{16.5}$ | 1.5 | 0 | 0.05 |
| Embodiment 14 | $(La_{0.4}Ce_{0.6})_{2.5}(Ca_{0.95}Eu_{0.05})_{1.5}Al_{0.06}Si_{11.94}O_{4.56}N_{16.44}$ | 1.5 | 0.06 | 0.05 |

Each of raw material powders having compositions shown in Table 13 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of about 0.92 MPa is applied into the atmosphere furnace, and then the temperature is additionally raised up to about 1700° C. for about 120 minutes. A firing temperature is about 1700° C., and a firing time is about 4 hours. The comparison examples 5 through 7 and the embodiments 12 through 14 are obtained through the method stated above.

Figure 14:
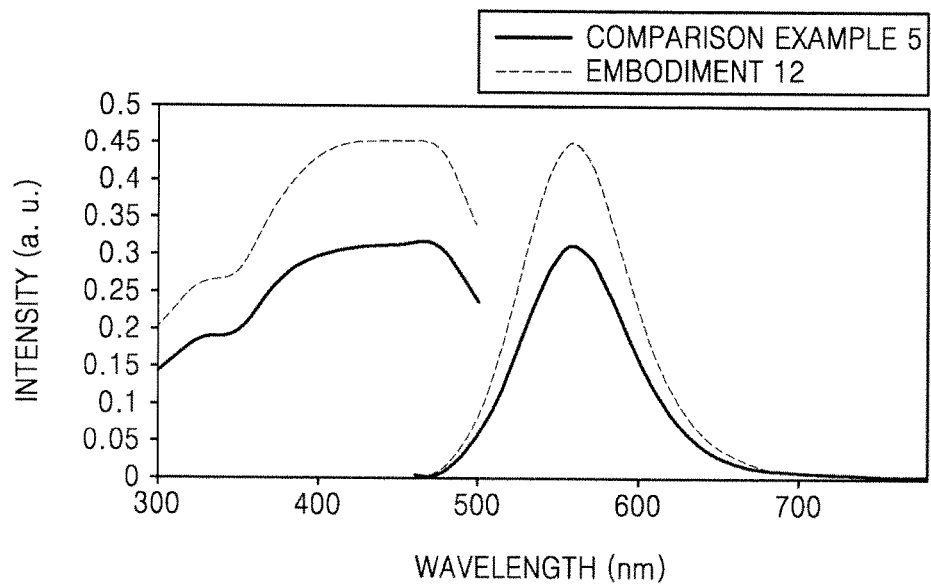
FIG. 14 is a graph illustrating an excitation spectrum for a light emission spectrum peak wavelength during a 450 nm excitation with respect to a comparison example 5 and an embodiment 12.
Figure 15:
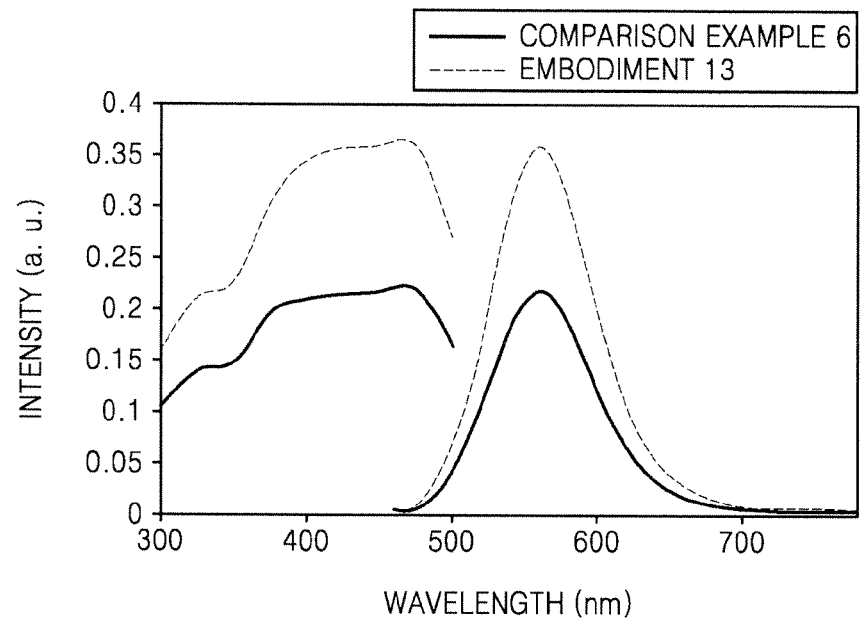
FIG. 15 is a graph illustrating an excitation spectrum for a light emission spectrum peak wavelength during a 450 nm excitation with respect to a comparison example 6 and an embodiment 13.
Figure 16:
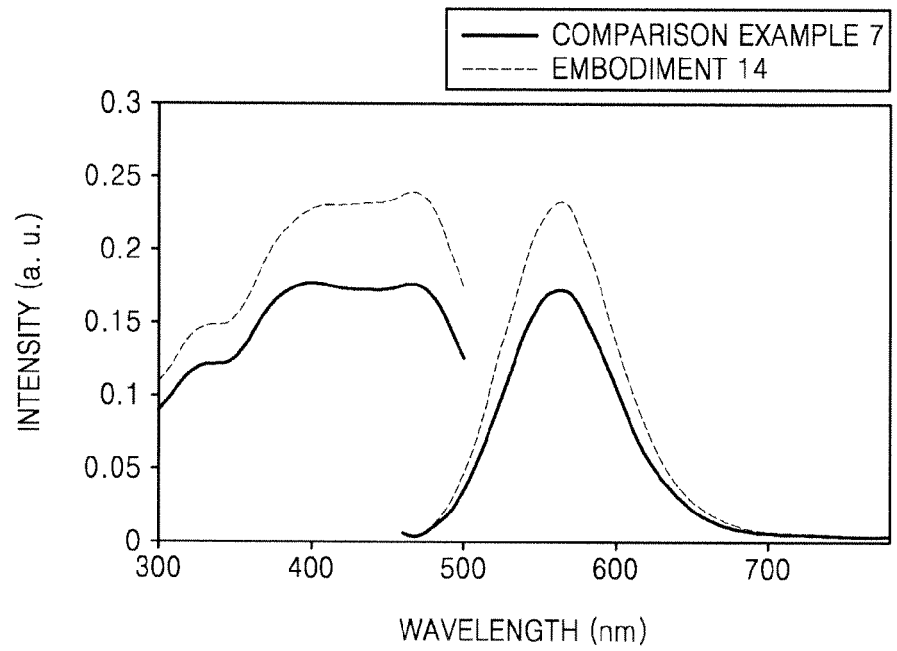
FIG. 16 is a graph illustrating an excitation spectrum for a light emission spectrum peak wavelength during a 450 nm excitation with respect to a comparison example 7 and an embodiment 14.

Excitation and light emission spectrums and chromaticity coordinates of the comparison examples 5 through 7 and embodiments 12 through 14 are measured at room temperature (25° C.) by using a general method. The measured excitation and light emission spectrums of the comparison example 5 and embodiment 12 are shown in FIG. 14, the measured excitation and light emission spectrums of the comparison example 6 and embodiment 13 are shown in FIG. 15, and the measured excitation and light emission spectrums of the comparison example 7 and embodiment 14 are shown in FIG. 16.

Figure 17:
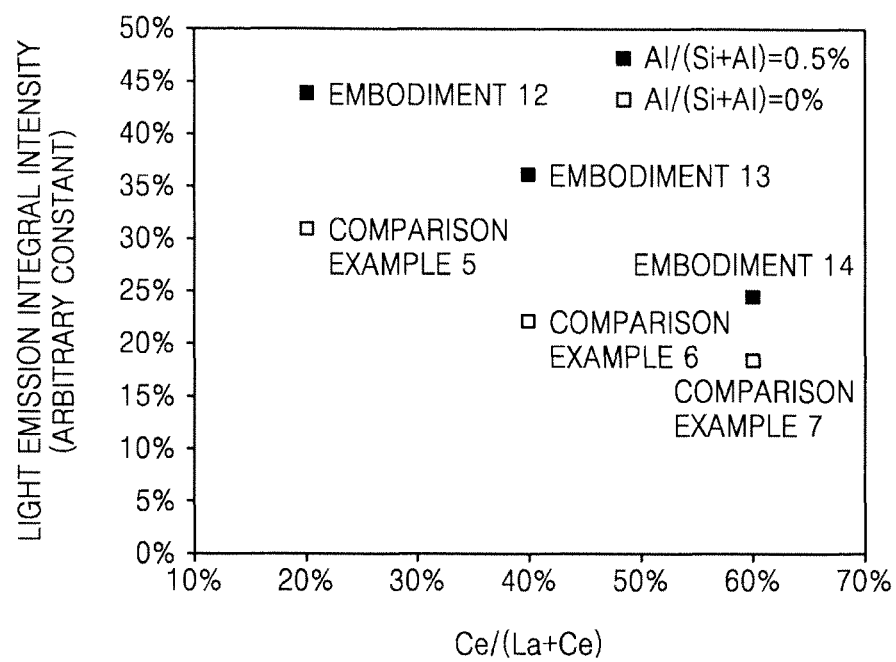
FIG. 17 is a graph in which the horizontal axis indicates a ratio of Ce to La in the Ln element of each of the comparison examples 5 through 7 and embodiments 12 through 14 and the vertical axis indicates light emission integral intensities.

FIG. 17 illustrates a graph in which the horizontal axis indicates a ratio of Ce to La in the Ln element of each of the comparison examples 5 through 7 and embodiments 12 through 14 and the vertical axis indicates light emission integral intensities.

Table 14 illustrates results obtained by measuring the light emission spectrums and chromaticity coordinates of the comparison examples 5 through 7 and embodiments 12 through 14. 'x' and 'y' in Table 14 are values of the XY colorimetric system (CIE 1931 colorimetric system) that is one of the CIE chromaticity coordinates. That is, 'x' and 'y' in Table 14 are different from x and y in the general formula (1) for the phosphor according to an embodiment of the inventive concept.

Referring to FIGS. 14 through 17 and Table 14, it may be understood that light emission characteristics are improved by adding Al to phosphor particles based on the determination of various Ln composition ratios.

Figure 18:
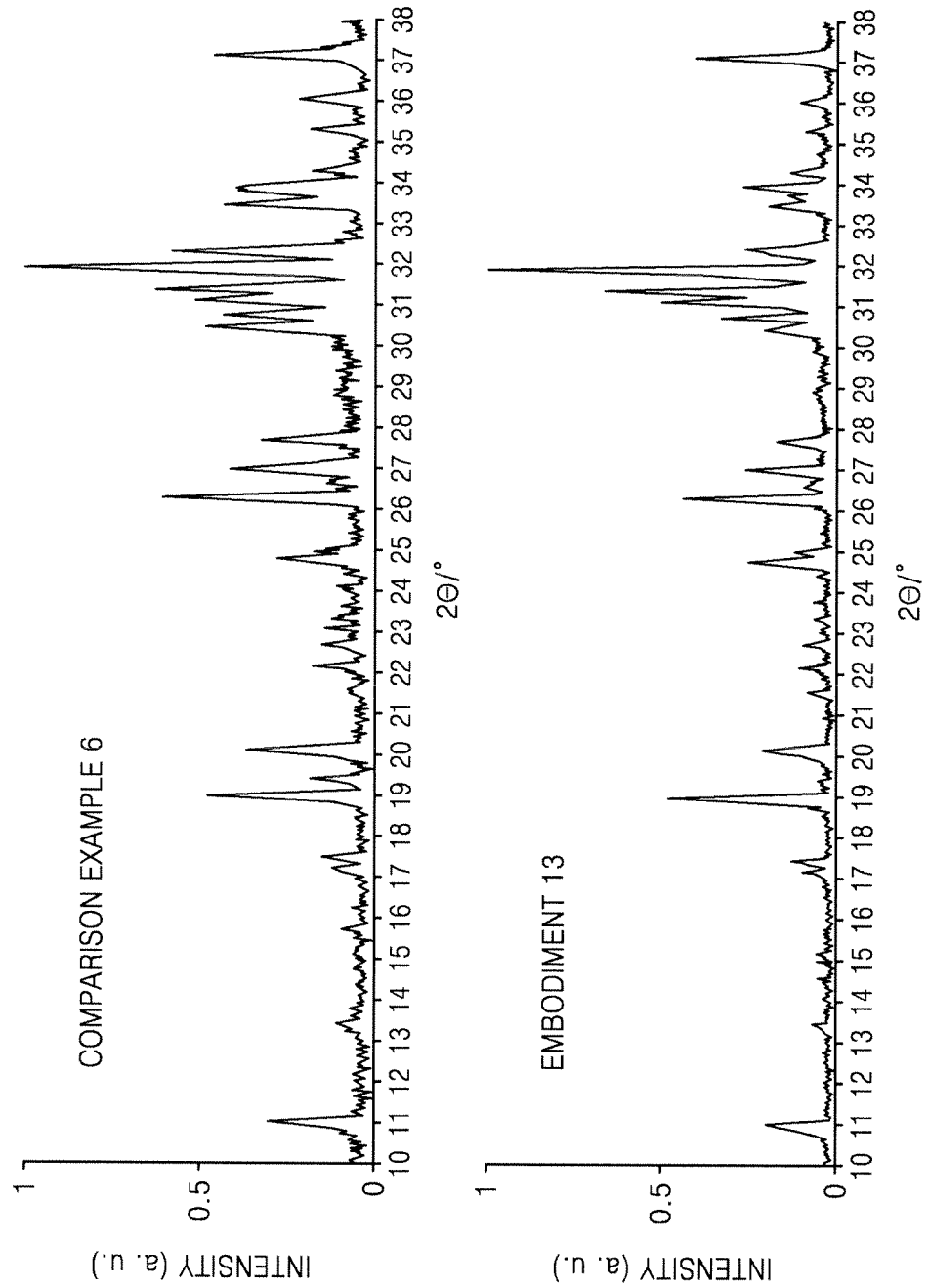
FIG. 18 is a diagram illustrating an XRD pattern (Cu Kα source) of the comparison example 6 and an XRD pattern of the embodiment 13.

FIG. 18 illustrates an XRD pattern (Cu Kα source) of the comparison example 6 and an XRD pattern of the embodiment 13.

It was proved, by a test using an H2-based cryostat, that a ratio G of light emission intensity at room temperature to light emission intensity at an extremely low temperature (4K) increases when Ce is included in La. As the ratio G approaches 100%, an energy loss (an inevitable energy loss that may not be reduced by an improvement of crystallizability) occurring by heat around room temperature at which a phosphor is used decreases, and thus, the quantum efficiency and brightness of the phosphor may be improved. The ratio G is about 82% when the content of La is 100%, and is about 89% when the content of Ce is 100%. However, when Ce is included in La, a $Si_3N_4$ phase or an $LnSi_3N_5$ phase (Ln=La, Ce), which it is difficult to technically remove during composition, may be incidentally generated. This may be understood from a comparison between FIG. 4 of Non-patent reference 1 (where Ln=Ce) and an XRD pattern (where Ln=La) disclosed in Patent reference 7. However, it may be understood, from a comparison between an XRD pattern of the comparison 6 and an XRD pattern of the embodiment 13, that an incidental generation of the two phases is remarkably suppressed by adding Al to a phosphor, like the phosphor according to an embodiment of the inventive concept. A main 2θ of an XRD peak of the $LnSi_3N_5$ phase is around 26.3°, 27.0°, 30.4°, and 32.4°, and a main 2θ of an XRD peak of the $Si_3N_4$ phase is around 36.1° and 27.0°. This is because a phosphor according to the general formula (1) tends to be more stabilized by receiving a small amount of Al compared to the $LnSi_3N_5$ phase.

A crystal that is represented by the general formula (1) is formed by the combination of an ion bonding layer (A layer) formed of Ca/Ln-free positive ions and a covalent bonding layer (B layer) formed of a tetrahedron of Si—(N, O)$_4$. A stability of a crystal phase is improved when a balance between the size of the A layer and the size of the B layer is well maintained. The size of the B layer increases when Si—(N, O)$_4$ is replaced with Al—O. Due to this effect, a size valence between the A layer and the B layer is improved, and a phase of the crystal that is represented by the general formula (1) is more stabilized. As a result, the $LnSi_3N_5$ phase is hardly generated.

Replacing Si with Al may increase the value of the ratio G in addition to the suppression of phases that are incidentally generated. In a Ce 100%-based phosphor, the ratio G is about 89% when there is no Al, and the ratio increases to about 92% when there is Al. The value of the ratio G of an

TABLE 14

| | Characteristics of light emission spectrum (Excitation 450 nm) | | | |
|---|---|---|---|---|
| | Light emission peak wavelength (nm) | Half-width (nm) | Chromaticity coordinates | |
| | | | x | y |
| Comparison 5 | 558 | 80 | 0.402 | 0.568 |
| Embodiment 12 | 557 | 79 | 0.400 | 0.570 |
| Comparison 6 | 559 | 83 | 0.406 | 0.562 |
| Embodiment 13 | 562 | 83 | 0.408 | 0.563 |
| Comparison 7 | 560 | 87 | 0.414 | 0.555 |
| Embodiment 14 | 562 | 86 | 0.413 | 0.556 |

La 100%-based phosphor that does not include Al is about 82%, and the value of the ratio G of a La 80%/Ce 20%-based phosphor that includes Al increases to about 88%. The value of the ratio G of a conventional YAG:Ce-based phosphor is about 85%. Thus, the yellow phosphor according to an embodiment of the inventive concept, in which Si is replace with Al, has the value (about 92%) of the ratio G that is remarkably higher than that of a conventional phosphor, and may greatly increase quantum efficiency.

According to SEM-EDX, it is understood that phosphor particles of the embodiment 13 which includes Al has reduced deviation of an Eu concentration compared to phosphor particles of the comparison example 6 that does not include Al. Standard deviation of the Eu concentration in 25 phosphor particles of the embodiment 13 is about 80% of that of the comparison example 6. If a second firing is performed, standard deviation of the Eu concentration in 25 phosphor particles of the embodiment 13 which includes Al is about ⅓ of that of the comparison example 6 that does not include Al. Thus, it is understood that activated Eu atoms are possibly around Al atoms.

As described above, the phosphor represented by the general formula (1), which includes Al, has outstanding characteristics compared to a phosphor which does not include Al.

[Comparison example 8 and Embodiments 15 through 17]: A comparison between compositions when parameters x and z other than y are fixed and y is changed under a condition $0 \leq y \leq 0.072$.

Synthesized chemical compositions of yellow phosphors are shown in Table 15. With respect to the comparison example 8 and the embodiments 15 through 17, $Ca_3N_2$, $Ca_2CO_3$, LaN, $La_2O_3$, EuN, $Eu_2O_3$, $Al_2O_3$, AlN, $SiO_2$, and $Si_3N_4$ are properly combined with one another so that the compositions satisfy chemical formulas of Table 15.

TABLE 15

| | Chemical formula | x | y | z |
|---|---|---|---|---|
| Comparison 8 | $(La)_{2.5}(Ca_{0.95}Eu_{0.05})_{1.5}Si_{12}O_{4.5}N_{16.5}$ | 1.5 | 0 | 0.05 |
| Embodiment 15 | $(La)_{2.5}(Ca_{0.95}Eu_{0.05})_{1.5}Al_{0.024}Si_{11.976}O_{4.524}N_{16.476}$ | 1.5 | 0.024 | 0.05 |
| Embodiment 16 | $(La)_{2.5}(Ca_{0.95}Eu_{0.05})_{1.5}Al_{0.048}Si_{11.952}O_{4.548}N_{16.452}$ | 1.5 | 0.048 | 0.05 |
| Embodiment 17 | $(La)_{2.5}(Ca_{0.95}Eu_{0.05})_{1.5}Al_{0.072}Si_{11.928}O_{4.572}N_{16.428}$ | 1.5 | 0.072 | 0.05 |

Each of raw material powders having compositions shown in Table 15 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of about 0.92 MPa is applied into the atmosphere furnace, and then the temperature is additionally raised up to about 1600° C. for about 120 minutes. A firing temperature is about 1600° C., and a firing time is about 4 hours. A fired body obtained after a firing process is completed is pulverized by using a mortar. In this manner, the comparison example 8 and the embodiments 15 through 17, which are in a phosphor powder state, are obtained.

Figure 19:
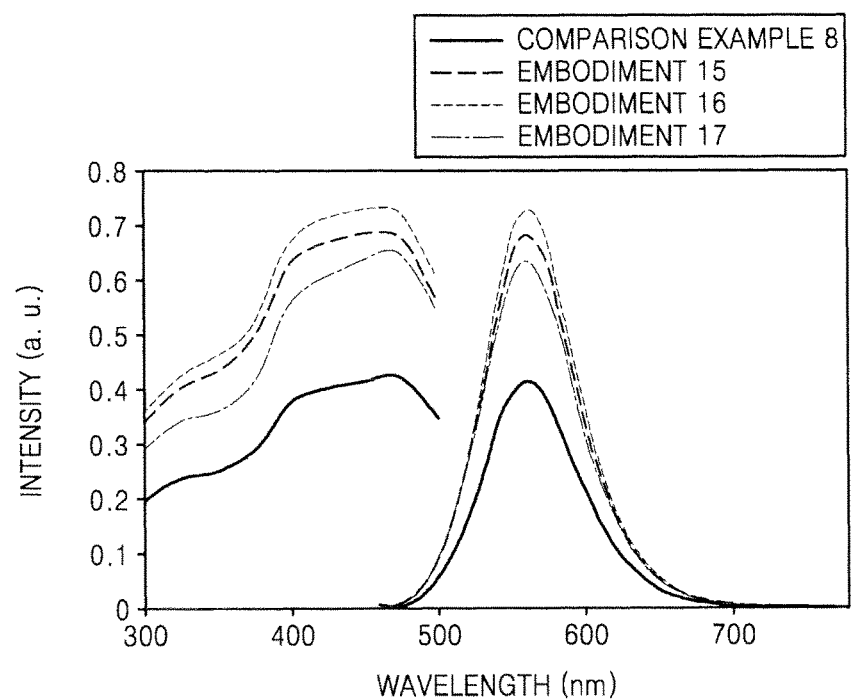
FIG. 19 is a graph illustrating an excitation spectrum for a light emission spectrum peak wavelength during a 450 nm excitation with respect to a comparison example 8 and embodiments 15 through 17.

Excitation and light emission spectrums and chromaticity coordinates of the comparison example 8 and embodiments 15 through 17 are measured at room temperature (25° C.) by using a general method. The measured excitation and light emission spectrums of the comparison example 8 and embodiments 15 through 17 are shown in FIG. 19.

Figure 20:
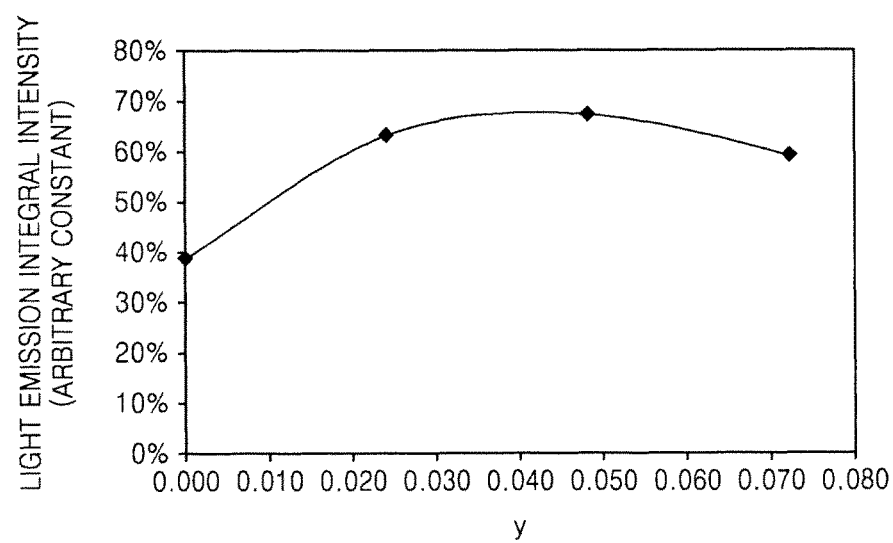
FIG. 20 is a graph illustrating light emission integral intensity for a value of y in the general formula (1) during a 450 nm excitation with respect to the comparison example 8 and the embodiments 15 through 17.

Light emission integral intensities of the comparison example 8 and embodiments 15 through 17 are measured by using a general method. The measured light emission integral intensities of the comparison example 8 and embodiments 15 through 17 are shown in FIG. 20. The light emission integral intensities of the comparison example 8 and embodiments 15 through 17, shown in FIG. 20, are light emission integral intensities for the value of y of the general formula (1) during a 450 nm excitation.

Table 16 illustrates results obtained by measuring the light emission spectrums and chromaticity coordinates of the comparison example 8 and embodiments 15 through 17. 'x' and 'y' in Table 16 are values of an XY colorimetric system (CIE 1931 colorimetric system) that is one of the CIE chromaticity coordinates. That is, 'x' and y in Table 16 are different from x and y in the general formula (1) for the phosphor according to an embodiment of the inventive concept.

TABLE 16

| | Characteristics of light emission spectrum (Excitation 450 nm) | | | |
|---|---|---|---|---|
| | Light emission peak wavelength (nm) | Half-width (nm) | Chromaticity coordinates | |
| | | | x | y |
| Comparison 8 | 558 | 75 | 0.415 | 0.562 |
| Embodiment 15 | 561 | 75 | 0.416 | 0.563 |
| Embodiment 16 | 563 | 74 | 0.417 | 0.562 |
| Embodiment 17 | 563 | 76 | 0.414 | 0.574 |

Referring to FIGS. 19 and 20 and Table 16, it may be understood that an improvement of light emission intensity or a change in light emission characteristics occurs by adjusting the value of y in the general formula (1), that is, an introduction ratio of Al.

[Comparison example 9 and Embodiment 18]: A comparison between a composition of y=0 and a composition of y=0.06 in a composition ratio of Ln=La, Gd.

Synthesized chemical compositions of yellow phosphors are shown in Table 17. With respect to the comparison example 9 and the embodiment 18, $Ca_3N_2$, $Ca_2CO_3$, LaN, $La_2O_3$, GdN, $Gd_2O_3$, LuN, $Lu_2O_3$, EuN, $Eu_2O_3$, $Al_2O_3$, AlN, $SiO_2$, and $Si_3N_4$ are properly combined with one another so that the compositions satisfy chemical formulas of Table 17.

TABLE 17

| | Chemical formula | x | y | z |
|---|---|---|---|---|
| Comparison 9 | $(La_{0.9}Gd_{0.1})_{2.5}(Ca_{0.95}Eu_{0.05})_{1.5}Si_{12}O_{4.5}N_{16.5}$ | 1.5 | 0 | 0.05 |
| Embodiment 18 | $(La_{0.9}Gd_{0.1})_{2.5}(Ca_{0.95}Eu_{0.05})_{1.5}Al_{0.06}Si_{11.94}O_{4.56}N_{16.44}$ | 1.5 | 0.06 | 0.05 |

Each of raw material powders having compositions shown in Table 17 is weighed and then sufficiently mixed by using a mortar, and an obtained mixture is filled in a crucible. A fill factor is about 40%.

The mixture filled in the crucible is set in an atmosphere furnace, and a carbon chip is installed around the mixture. The temperature is raised from room temperature to about 1000° C. for about 200 minutes in a vacuum, nitrogen is input to the atmosphere furnace under about 1000° C., and pressure of about 0.92 MPa is applied to the atmosphere furnace, and then the temperature is additionally raised up to about 1700° C. for about 120 minutes. Next, a firing process is performed at a firing temperature of about 1700° C. for a firing time of about 4 hours. In this manner, the comparison example 9 and the embodiment 18, which are in a phosphor powder state, are obtained.

Figure 21:
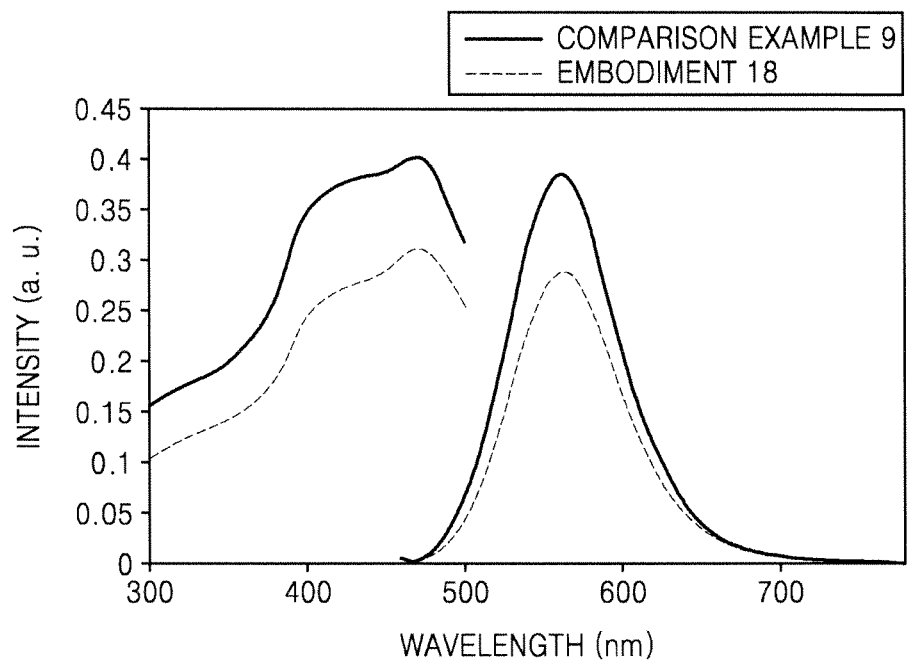
FIG. 21 is a graph illustrating an excitation spectrum for a light emission spectrum peak wavelength during a 450 nm excitation with respect to a comparison example 9 and an embodiment 18.

Excitation and light emission spectrums and chromaticity coordinates of the comparison example 9 and embodiment 18 are measured at room temperature (25° C.) by using a general method. The measured excitation and light emission spectrums of the comparison example 9 and embodiment 18 are shown in FIG. 21.

Table 18 illustrates results obtained by measuring the light emission spectrums and chromaticity coordinates of the comparison example 9 and embodiment 18. 'x' and 'y' in Table 18 are values of the XY colorimetric system (CIE 1931 colorimetric system) that is one of the CIE chromaticity coordinates. That is, 'x' and 'y' in Table 18 are different from x and y in the general formula (1) for the phosphor according to an embodiment of the inventive concept.

TABLE 18

| | Characteristics of light emission spectrum (Excitation 450 nm) | | | |
|---|---|---|---|---|
| | Light emission peak wavelength (nm) | Half-width (nm) | Chromaticity coordinates | |
| | | | x | y |
| Comparison 9 | 566 | 82 | 0.419 | 0.556 |
| Embodiment 18 | 561 | 81 | 0.411 | 0.562 |

Referring to FIG. 21 and Table 18, it may be understood that an improvement of light emission intensity or a change in light emission characteristics occurs by adjusting the value of y in the general formula (1), that is, an introduction ratio of Al.

Embodiments A-L

In a compound that is represented by the general formula (1), a flux including F atoms is checked in a composition in which Ln includes 80% of La and 20% of Ce (Ln=La 80% and Ce 20%), x=1.5, y=0.06, and z=0.05.

Each of raw material powders having compositions of chemical formulas shown in Table 19 is weighed and then sufficiently mixed. With respect to each embodiment, a flux of 1 wt % is added to and mixed with a mixture obtained by the mixing. A finally obtained mixture is filled in a crucible. A fill factor is about 40%. The mixture filled in the crucible is set in an atmosphere furnace. Next, the temperature is raised from room temperature to about 750° C. for about 200 minutes in a vacuum, an atmosphere gas including nitrogen 95% and hydrogen 5% is input to the atmosphere furnace under about 750° C., and an atmosphere pressure is applied into the atmosphere furnace, and then the temperature is additionally raised up to about 1500° C. for about 75 minutes. A firing temperature is about 1500° C., and a firing time is about 8 hours. A fired body obtained after a firing process is completed is pulverized by using a mortar. In this manner, the embodiments A through L, which are in a phosphor powder state, are obtained.

TABLE 19

| Chemical formula | | x | y | z | Used Flux |
|---|---|---|---|---|---|
| Embodiment A | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | Not used |
| Embodiment B | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $MgF_2$ |
| Embodiment C | $(La_{0.8}Ce_{0.2})_{2.5}(Ca_{0.95}Eu_{0.05})_{1.5}Al_{0.06}S_{11.94}O_{4.56}N_{16.44}$ | 1.5 | 0.06 | 0.05 | $CaF_2$ |
| Embodiment D | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $SrF_2$ |
| Embodiment E | $(Fa_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $BaF_2$ |
| Embodiment F | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $AlF_3$ |
| Embodiment G | $(La_{0.8}C_{e0.2})_{2.5}(Ca_{0.95}Eu_{0.05})_{1.5}Al_{0.06}Si_{11.94}O_{4.56}N_{16.44}$ | 1.5 | 0.06 | 0.05 | $ScF_3$ |
| Embodiment H | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $YF_3$ |
| Embodiment I | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $LaF_3$ |
| Embodiment J | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $CeF_3$ |
| Embodiment K | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $GdF_3$ |
| Embodiment L | $(La_{0.8}Ce_{0.2})_{2.5}(Ca_{0.95}Eu_{0.05})_{1.5}Al_{0.06}Si_{11.94}O_{4.56}N_{16.44}$ | 1.5 | 0.06 | 0.05 | $LuF_3$ |

By using a fluoride flux, a target compound may be obtained even at a low temperature of 1500° C.

Figure 22:
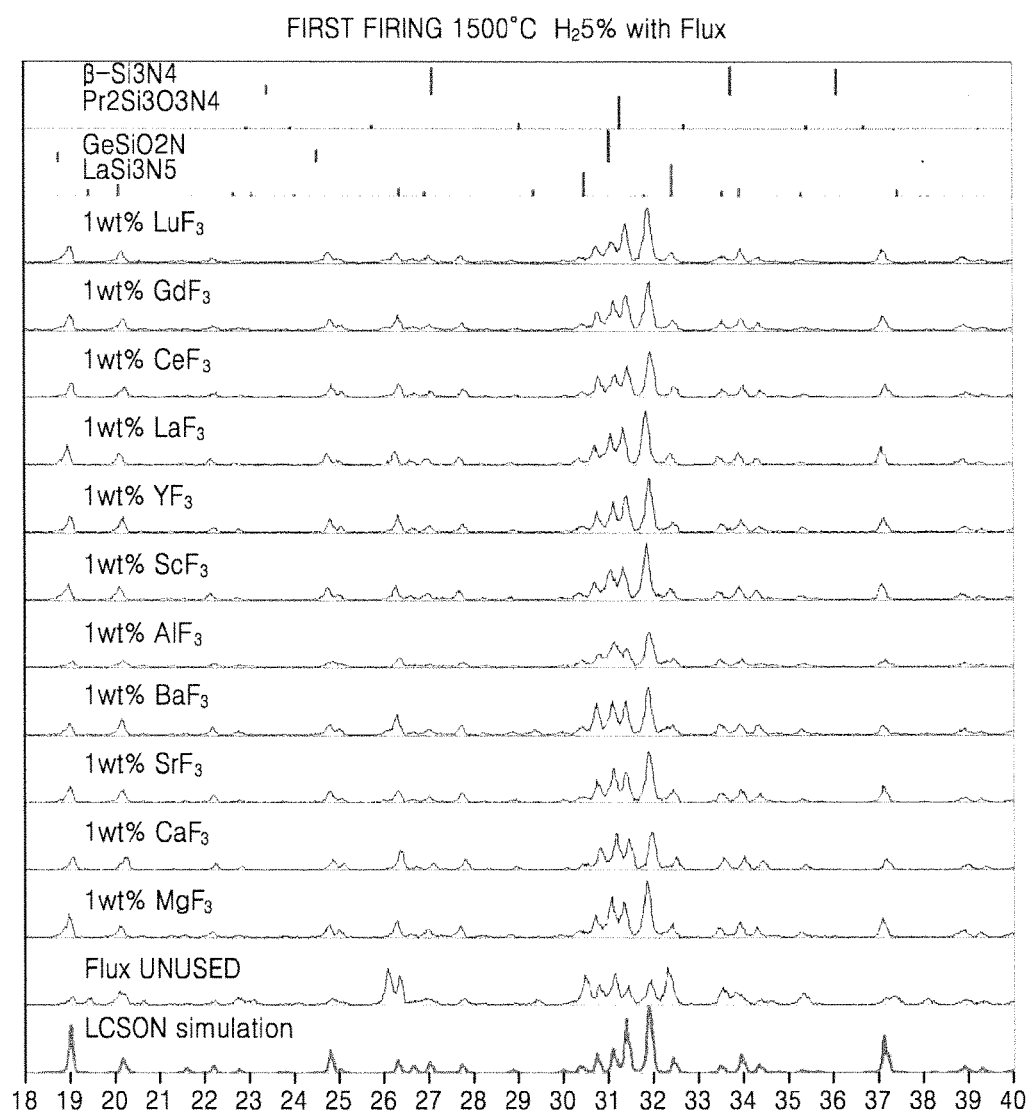
FIG. 22 is a diagram illustrating XRD measurement results of embodiments A through L.

FIG. 22 illustrates XRD measurement results of the embodiments A through L. As shown in FIG. 22, a target phase may not be obtained in the embodiment A that does not use a flux, and may be obtained in each of the embodiments B through L that use a flux.

Figure 23:
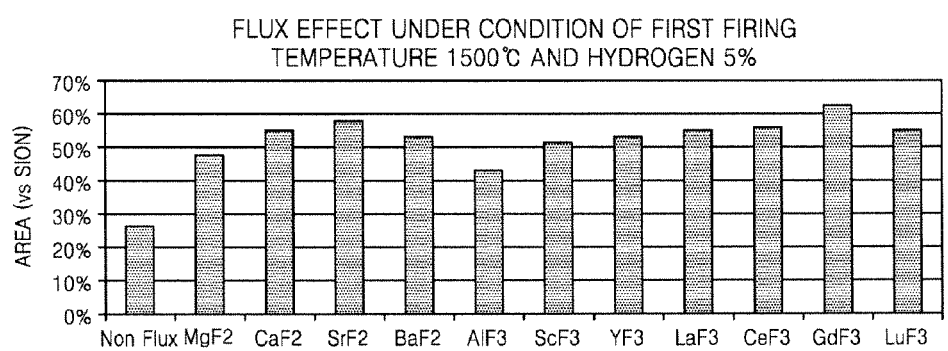
FIG. 23 is a diagram illustrating light emission integral intensities that may be obtained when an excitation is performed with light of 450 nm with respect to embodiments A through L.

FIG. 23 illustrates light emission integral intensities that may be obtained when an excitation is performed with light of 450 nm wavelength with respect to the embodiments A through L. The embodiments B through L that use a flux have excellent light emission integral intensities compared to the embodiment A that does not use a flux.

Table 20 illustrates results obtained by performing a composition analysis on cations in EDX with respect to particles of the embodiment H. Referring to FIG. 23, it may be understood that Y of $YF_3$ used as a flux remains in a resultant material.

Next, devices including a yellow phosphor according to one of embodiments of the inventive concept are described below. Like reference numerals in the drawings denote like elements.

Figure 24:
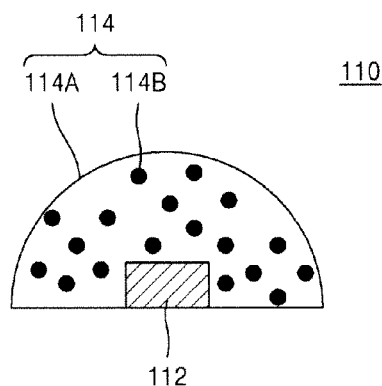
FIG. 24 is a schematic diagram of a white light-emitting device including a phosphor according to an embodiment of the inventive concept.

FIG. 24 is a schematic diagram of a white light-emitting device 110 including a phosphor according to an embodiment of the inventive concept.

The white light-emitting device 110 includes a blue LED chip 112 and a resin packaging unit 114 that has the shape of a convex lens and covers or packages the blue LED chip 112.

The resin packaging unit 114 has the shape of a convex lens to secure a wide view angle. The blue LED chip 112 may be directly mounted on a separate circuit substrate. The resin packaging unit 114 includes a resin 114A and a phosphor 114B dispersed in the resin 114A. The resin 114A may be a silicon resin, an epoxy resin, or a combination thereof. The phosphor 114B is a yellow phosphor according

TABLE 20

| | Point 1 | Point 2 | Point 3 | Point 4 | Point 5 | Point 6 | Point 7 |
|---|---|---|---|---|---|---|---|
| Al | 2.08333 | 1.6686 | 1.44654 | 1.34443 | 1.0342 | 1.5664 | 1.5251 |
| Si | 72.9167 | 71.174 | 71.1321 | 71.5109 | 74.622 | 72.368 | 71.46 |
| Ca | 6.58333 | 6.5593 | 6.91824 | 8.00256 | 6.603 | 6.8296 | 6.9172 |
| Y | 1 | 0.4603 | 0.50314 | 0.3201 | 0.3182 | 0.5013 | 0.5447 |
| La | 13.9167 | 15.938 | 15.7233 | 14.7887 | 13.922 | 14.85 | 15.142 |
| Ce | 3.08333 | 3.7399 | 3.71069 | 3.58515 | 3.1026 | 3.3835 | 3.9216 |
| Eu | 0.41667 | 0.4603 | 0.56604 | 0.44814 | 0.3978 | 0.5013 | 0.4902 |
| Sum | 100 | 100 | 100 | 100 | 100 | 100 | 100 |
| Eu/(Ca + Eu) | 6.0% | 6.6% | 7.6% | 5.3% | 5.7% | 6.8% | 6.6% |
| Al/(Al + Si) | 2.8% | 2.3% | 2.0% | 1.8% | 1.4% | 2.1% | 2.1% |
| (Ca + Eu)/(Ca + Eu + La + Ce) | 29.2% | 26.3% | 27.8% | 31.5% | 29.1% | 28.7% | 28.0% |
| Ce/(La + Ce) | 18.1% | 19.0% | 19.1% | 19.5% | 18.2% | 18.6% | 20.6% |
| (Si + Al)/(Ca + Ce + La + Eu) | 3.13 | 2.73 | 2.70 | 2.72 | 3.15 | 2.89 | 2.76 |
| Y/(Y + Ce + La) | 5.6% | 2.3% | 2.5% | 1.7% | 1.8% | 2.7% | 2.8% | to an embodiment of the inventive concept, for example, a yellow phosphor that may be represented by the general formula (1).

A main wavelength band of blue light that is emitted from the blue LED chip 112 may be from about 435 nm to about 465 nm.

Figure 25:
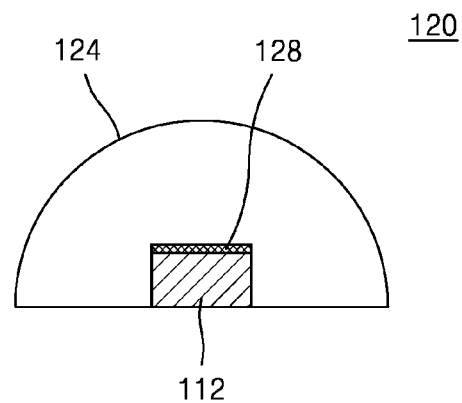
FIG. 25 is a schematic diagram of a white light-emitting device including a phosphor according to another embodiment of the inventive concept.

FIG. 25 is a schematic diagram of a white light-emitting device 120 including a phosphor according to another embodiment of the inventive concept.

The white light-emitting device 120 includes a blue LED chip 112, a resin packaging unit 124 that has the shape of a convex lens and covers or packages the blue LED chip 112, and a wavelength converter 128 covering the blue LED chip 112. The resin packaging unit 124 may be formed of a silicon resin, an epoxy resin, or a combination thereof.

The wavelength converter 128 may directly contact an upper surface of the blue LED chip 112. The wavelength converter 128 includes a yellow phosphor according to an embodiment of the inventive concept, for example, a yellow phosphor that may be represented by the general formula (1).

Figure 26:
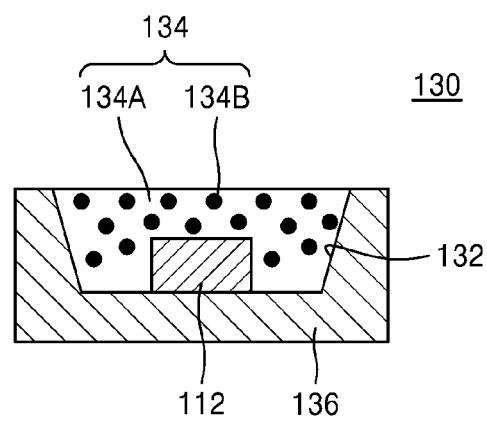
FIG. 26 is a schematic diagram of a white light-emitting device including a phosphor according to another embodiment of the inventive concept.

FIG. 26 is a schematic diagram of a white light-emitting device 130 including a phosphor according to another embodiment of the inventive concept.

The white light-emitting device 130 includes a package body 136 with a reflective cup 132 formed in the center thereof, a blue LED chip 112 mounted on the bottom of the reflective cup 132, and a resin packaging unit 134 that encapsulates the blue LED chip 112 in the reflective cup 132.

The resin packaging unit 134 includes a resin 134A and a phosphor 134B dispersed in the resin 134A. The resin 134A may be a silicon resin, an epoxy resin, or a combination thereof The phosphor 134B is a yellow phosphor according to an embodiment of the inventive concept, for example, a yellow phosphor that may be represented by the general formula (1).

Figure 27:
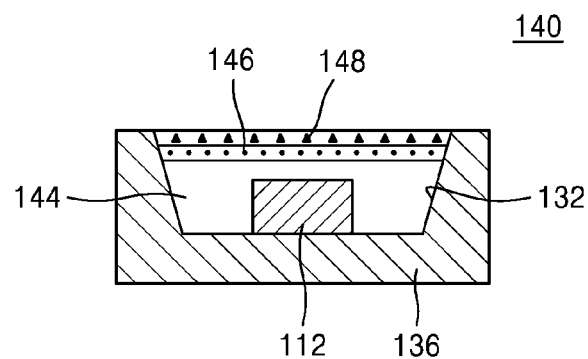
FIG. 27 is a schematic diagram of a white light-emitting device including a phosphor according to another embodiment of the inventive concept.

FIG. 27 is a schematic diagram of a white light-emitting device 140 including a phosphor according to another embodiment of the inventive concept.

The white light-emitting device 140 includes a package body 134 with a reflective cup 132 formed in the center thereof and a blue LED chip 112 mounted on the bottom of the reflective cup 132. A transparent resin packaging unit 144, which encapsulates the blue LED chip 112, and a plurality of phosphor-containing resins 146 and 148 are formed in the reflective cup 132. The plurality of phosphor-containing resins 146 and 148 may form a wavelength converter.

At least one of the plurality of phosphor-containing resins 146 and 148 includes a yellow phosphor according to an embodiment of the inventive concept, for example, a yellow phosphor that may be represented by the general formula (1).

At least one of the plurality of phosphor-containing resins 146 and 148 may further include at least one of the following phosphors in addition to the yellow phosphor according to an embodiment of the inventive concept, for example, the yellow phosphor that may be represented by the general formula (1).

Oxide-based phosphor: yellow and green $Y_3Al_5O_{12}$:Ce, $Tb_3Al_5O_{12}$:Ce, and $Lu_3Al_5O_{12}$:Ce Silicate-based phosphor: yellow and green $(Ba,Sr)_2SiO_4$:Eu and yellow and orange $(Ba,Sr)_3SiO_5$:Ce Nitride-based phosphor: green β-SiAlON:Eu, yellow $L_3Si_6O_{11}$:Ce, orange α-SiAlON:Eu, and red $CaAlSiN_3$:Eu, $Sr_2Si_5N_8$:Eu, $SrSiAl_4N_7$:Eu, $SrLiAl_3N_4$:Eu Fluoride-based phosphor: KSF-based red $K_2SiF_6$:$Mn^{4+}$ A light-emitting device according to some embodiments of the inventive concept may form at least one selected from a white light-emitting device package including at least one of yellow, green, and red phosphors in a blue LED chip, a green or red light-emitting device package including at least one of green and red phosphors in a blue LED chip, a green light-emitting device package that does not include a phosphor, and a red light-emitting device package that does not include a phosphor. A package module including any one of the above-stated light emitting device packages emits light of which (x, y) coordinates of the CIE 1931 colorimetric system is positioned on a line segment that connects (0.4476, 0.4074), (0.3484, 0.3516), (0.3101, 0.3162), (0.3128, 0.3292), and (0.3333, 0.3333). Alternatively, the (x, y) coordinates of the CIE 1931 colorimetric system may be positioned in an area surrounded by the line segment and a black-body radiation spectrum. A color temperature of the light may be in the range of about 2000 K to about 20000 K.

Figure 28:
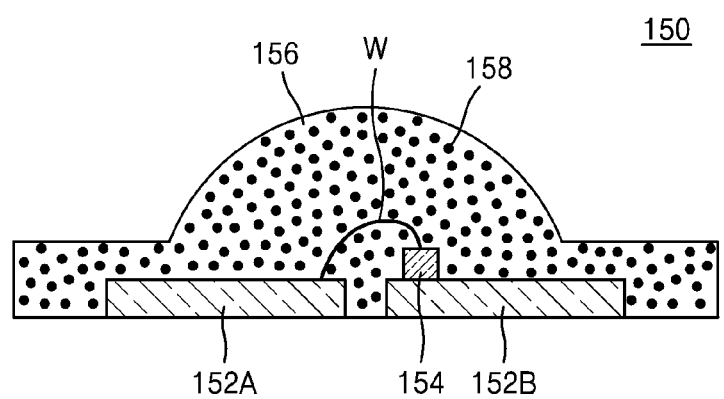
FIG. 28 is a schematic diagram of a white light-emitting device including a phosphor according to another embodiment of the inventive concept.

FIG. 28 is a schematic diagram of a white light-emitting device 150 including a phosphor according to another embodiment of the inventive concept.

The light-emitting device 150 includes a pair of lead frames 152A and 152B. At least one surface (e.g., a lower surface) of each of the pair of lead frames 152A and 152B is exposed to the outside and thus may facilitate heat dissipation while being provided as a terminal. A light-emitting chip 154 is disposed on any one of the pair of lead frames 152A and 152B, and a wire W may be used for an electrical connection of the light-emitting chip 154 (e.g., an electrical connection of the light-emitting chip 154 to the other of the pair of lead frames 152A and 152B). An encapsulant 156 has a lens shape and may be connected to the light-emitting chip 154 and the lead frames 152A and 152B to maintain shapes of the light-emitting chip 154 and lead frames 152A and 152B.

Inside the encapsulant 156, a wavelength converter 158 is formed in an optical path of the light-emitting chip 154. The waveform converter 158 includes a yellow phosphor according to an embodiment of the inventive concept, for example, a yellow phosphor that may be represented by the general formula (1).

Figure 29:
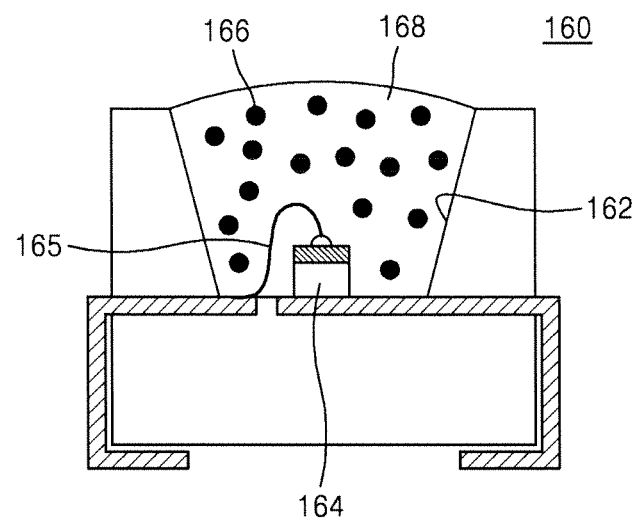
FIG. 29 is a schematic diagram of a white light-emitting device including a phosphor according to another embodiment of the inventive concept.

FIG. 29 is a schematic diagram of a white light-emitting device 160 including a phosphor according to another embodiment of the inventive concept.

Referring to FIG. 29, the light-emitting device 160 may be formed of a blue LED or a white LED using a long wavelength ultraviolet LED. The light-emitting device 160 includes a reflective cup 162 and an LED chip 164 mounted on the reflective cup 162. The LED chip 164 may be an InGaN-based LED or a GaN-based LED.

In addition, the light-emitting device 160 includes an electrode line 165 connected to the LED chip 164, a phosphor 166 that is excited by light emitted from the LED chip 164, and a light-transmissive resin 168 that seals the LED chip 164. The light-transmissive resin 168 may be an epoxy resin, a silicon resin, or a combination thereof.

The phosphor 166 functions as a wavelength conversion material. The phosphor 166 is a yellow phosphor according to an embodiment of the inventive concept, for example, a yellow phosphor that may be represented by the general formula (1).

The phosphor 166 is formed outside the LED chip 164 so that light emitted from an emissive layer of the LED chip 164 acts as an excitation light of the phosphor 166.

A process in which white light is implemented in the light-emitting device 160 is as follows. Blue light emitted from the LED chip 164 passes through the phosphor 166 that is a yellow phosphor according to an embodiment of the inventive concept. In this case, some of the blue light excites the phosphor 166 to implement yellow light, and the remaining blue light penetrates the phosphor 166 intactly as blue light. Yellow light implemented by the excitation of the phosphor 166 and light penetrating the phosphor 166 intactly as blue light overlap each other to thereby provide white light.

Figure 30:
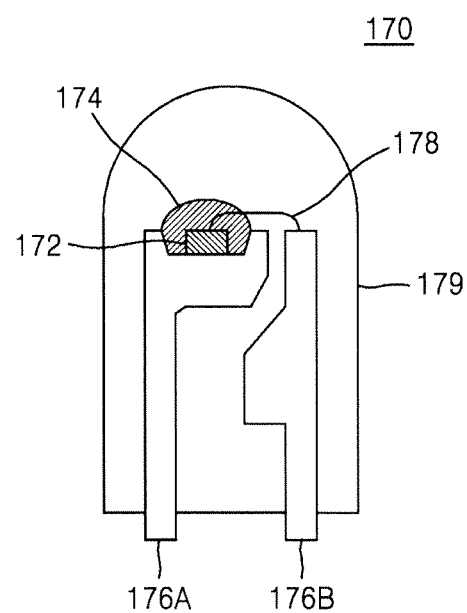
FIG. 30 is a schematic diagram of a capsule-type lighting device including a phosphor according to another embodiment of the inventive concept.

FIG. 30 is a schematic diagram of a capsule-type lighting device 170 including a phosphor according to another embodiment of the inventive concept.

Referring to FIG. 30, the capsule-type lighting device 170 includes a light source 172 that emits light, and a phosphorescent layer 174 that is disposed on an optical path of the light source 172 and is excited by the light emitted from the light source to emit light. The light source 172 may be a semiconductor diode that may emit light in a recombination process occurring at a PN junction of a semiconductor. The semiconductor diode may be an ultraviolet (UV) LED, which may light of a near ultraviolet region or ultraviolet region, or a blue LED that may emit light of a blue visible light region. The phosphorescent layer 174 includes a yellow phosphor according to an embodiment of the inventive concept, for example, a yellow phosphor that may be represented by the general formula (1).

The capsule-type lighting device 170 may further include a plurality of leads 176A and 176B for supplying power to the light source 172 and a wire 178 that electrically connects the light source 172 to the lead 176B.

The light source 172, the plurality of leads 176A and 176B, and the wire 178 may be sealed in a capsule type by a sealant 179, such as light-transmissive resin, rubber, and glass.

The capsule-type lighting device 170 may be a white diode lamp. White light may be implemented by mixing some of light emitted from the light source 172 and wavelength-converted light emitted from a phosphor excited in the phosphorescent layer 174. In order to implement white light, the light source 172 may be a blue LED. The blue LED may be, for example, an InGaN-based diode.

The capsule-type lighting device 170 may be used as a lighting apparatus or a display device. Alternatively, the capsule-type lighting device 170 may be applied to a backlight unit of a display device such as a liquid crystal display device.

Figure 31:
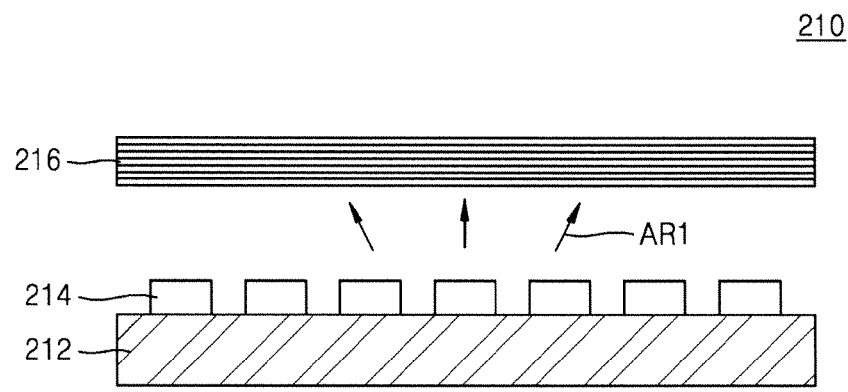
FIG. 31 is a diagram illustrating an example in which a semiconductor light-emitting device including a phosphor according to an embodiment of the inventive concept is applied to a backlight unit.

FIG. 31 is a diagram illustrating an example in which a semiconductor light-emitting device including a phosphor according to an embodiment of the inventive concept is applied to a backlight unit 210.

Referring to FIG. 31, the backlight unit 210 includes a light source 214 mounted on a substrate 212, and at least one optical sheet 216 disposed above the light source 214. The light source 214 includes a yellow phosphor according to an embodiment of the inventive concept, for example, a yellow phosphor that may be represented by the general formula (1).

In the backlight unit 210, the light source 214 may emit light toward the optical sheet 216 as indicated by an arrow AR1.

Figure 32:
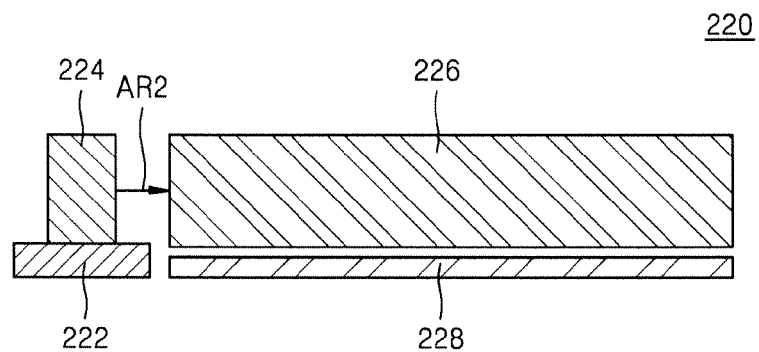
FIG. 32 is a diagram illustrating another example in which a semiconductor light-emitting device including a phosphor according to an embodiment of the inventive concept is applied to a backlight unit.

FIG. 32 is a diagram illustrating another example in which a semiconductor light-emitting device including a phosphor according to an embodiment of the inventive concept is applied to a backlight unit 220.

Referring to FIG. 32, light from a light source 224 mounted on a substrate 222 is radiated toward a light guiding panel 226 in a direction indicated by an arrow AR2. The light radiated in this manner may be incident on the light guiding panel 226 and then be converted into a form of a surface light source. Light passing through the light guiding panel 226 may be radiated upward. A reflective layer 228 may be disposed under the light guiding panel 226 to improve light extraction efficiency.

Figure 33:
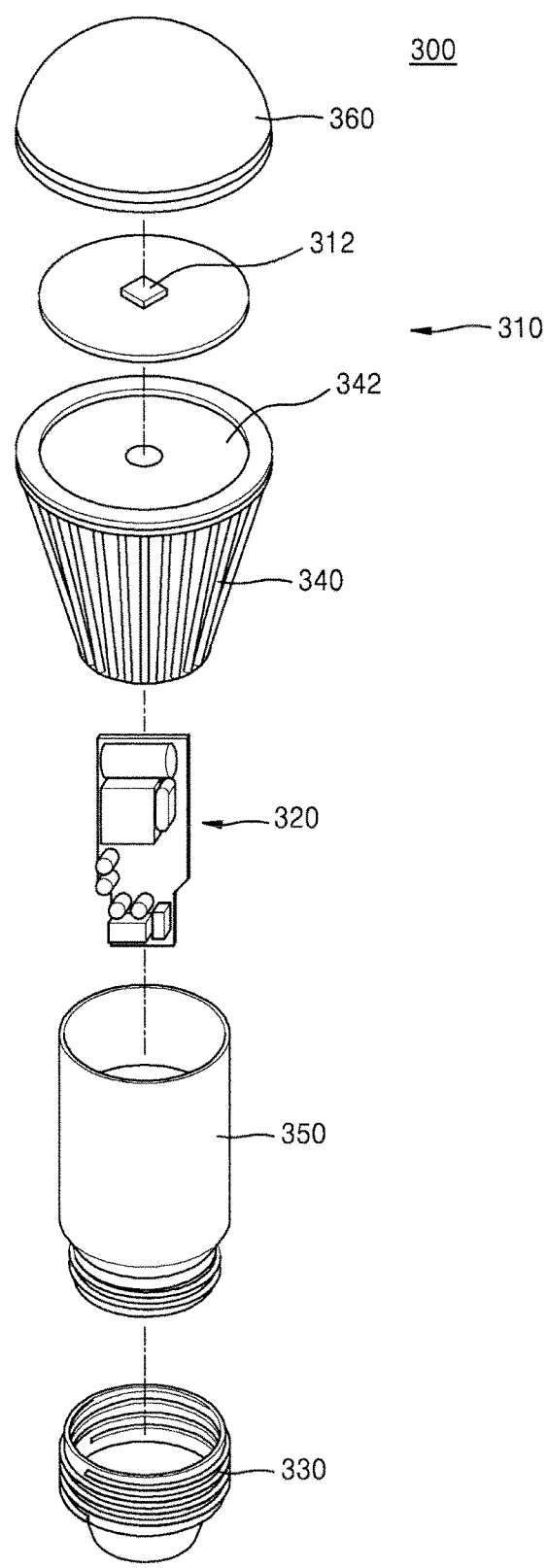
FIG. 33 is an exploded perspective view illustrating an example in which a semiconductor light-emitting device including a phosphor according to an embodiment of the inventive concept is applied to a lighting apparatus.

FIG. 33 is an exploded perspective view illustrating an example in which a semiconductor light-emitting device including a phosphor according to an embodiment of the inventive concept is applied to a lighting apparatus 300.

The lighting apparatus 300 including a bulb-type lamp is illustrated in FIG. 33. The lighting apparatus 300 includes a light-emitting module 310, a driving unit 320, and an external connection unit 330. In addition, the lighting apparatus 300 may further include an external housing 340, an internal housing 350, and a cover unit 360.

The light-emitting module 310 includes a semiconductor light-emitting device 312. The semiconductor light-emitting device 312 includes a yellow phosphor according to an embodiment of the inventive concept, for example, a yellow phosphor that may be represented by the general formula (1).

The external housing 310 may function as a heat dissipation unit. The external housing 340 may include a heat dissipation plate 342 for improving a heat dissipation effect.

The cover unit 360 may be mounted on the light-emitting module 310 and have a convex lens shape.

The driving unit 320 may be mounted in the internal housing 350 and be connected to the external connection unit 330 having a socket structure to receive a power supply voltage from an external power supply. In addition, the driving unit 320 may be used for driving the semiconductor light-emitting device 312 of the light-emitting module 310. In some embodiments, the driving unit 320 may include an AC-DC converter or a rectification circuit component.

Figure 34:
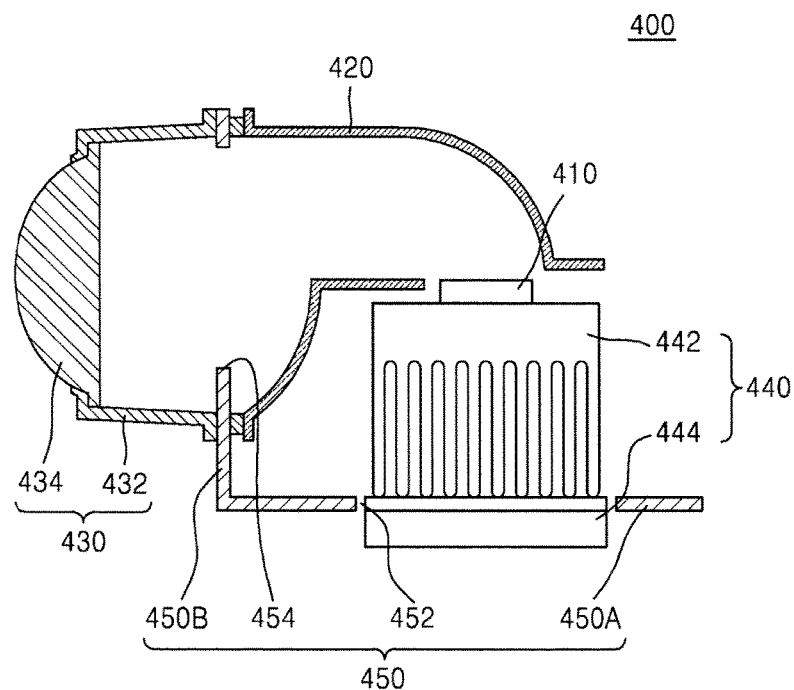
FIG. 34 is a diagram illustrating an example in which a semiconductor light-emitting device including a phosphor according to an embodiment of the inventive concept is applied to a head lamp.

FIG. 34 is a diagram illustrating an example in which a semiconductor light-emitting device including a phosphor according to an embodiment of the inventive concept is applied to a head lamp 400.

Referring to FIG. 34, the head lamp 400 includes a light source 410, a reflective unit 420, a lens cover unit 430, a heat dissipation unit 440, and a housing 450. The lens cover unit 430 may include a hollow guide 432 and a lens 434. The heat dissipation unit 440 may dissipate heat generated from the light source 410 to the outside. The heat dissipation unit 440 may include a heat sink 442 and a cooling fan 444 so that effective heat dissipation is performed.

The housing 450 may fix and support the reflective unit 420 and the heat dissipation unit 440. The housing 450 includes a first surface 450A and a second surface 450B that is integrally connected to the first surface 450A and is bent in a direction which is perpendicular to the first surface 450A. A central hole 452, through which the heat dissipation unit 440 is combined so as to be mounted in the first surface 450A, may be formed in the first surface 450A of the housing 450. In the housing 450, a front hole 454 for fixing the reflective unit 420 so that the reflective unit 420 is positioned above the light source 410 may be formed in the second surface 450B. Accordingly, a front side of the reflective unit 420 may be opened, the reflective unit 420 may be fixed to the housing 450 so that the opened front side of the reflective unit 420 corresponds to the front hole 454, and light reflected from the reflective unit 420 may pass through the front hole 454 and be output to the outside.

The light source 410 includes a semiconductor light-emitting device including a yellow phosphor according to an embodiment of the inventive concept, for example, a yellow phosphor that may be represented by the general formula (1).

The head lamp 400 may be used as a car light and the like.

Figure 35:
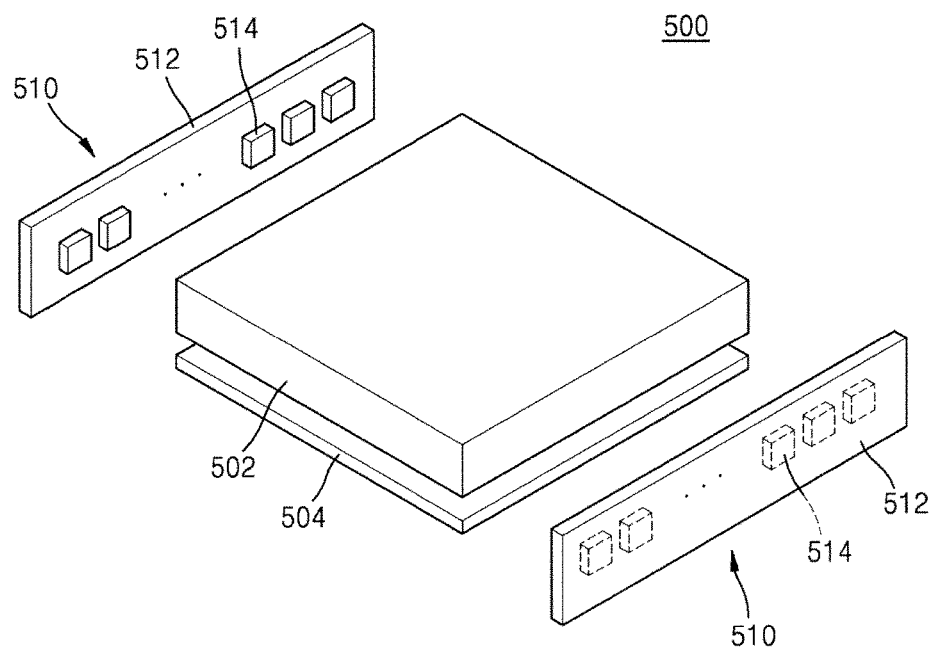
FIG. 35 is a schematic perspective view of an edge-type backlight unit that is an example of a backlight unit which uses, as a light source, a light-emitting device including a phosphor according to an embodiment of the inventive concept.

FIG. 35 is a schematic perspective view of an edge-type backlight unit 500 that is an example of a backlight unit which uses, as a light source, a light-emitting device including a phosphor according to an embodiment of the inventive concept.

Referring to FIG. 35, the edge-type backlight unit 500 may include a light guiding panel 502 and an LED light source module 510 that is disposed at both sides of the light guiding panel 502. Although the LED light source module 510 in FIG. 35 is disposed at both sides of the light guiding panel 502, the LED light source module 510 may be disposed at only one side of the light guiding panel 502 according to design considerations.

A reflective plate 504 may be additionally disposed under the light guiding panel 502.

The LED light source module 510 includes a printed circuit board 512 and a plurality of LED light sources 514 mounted on the upper surface of the printed circuit board 512. Each of the plurality of LED light sources 514 may include a light-emitting device including a phosphor according to an embodiment of the inventive concept.

Figure 36:
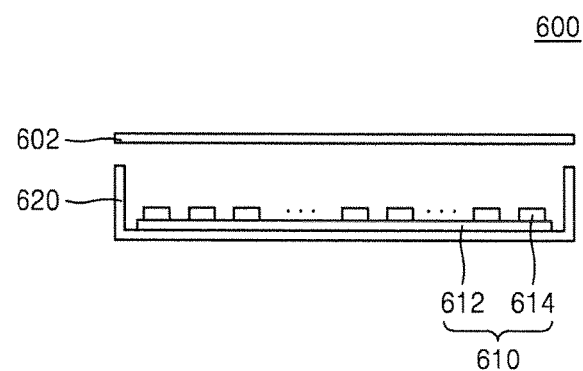
FIG. 36 is a schematic perspective view of a direct type backlight unit that is another example of a backlight unit which uses, as a light source, a light-emitting device including a phosphor according to an embodiment of the inventive concept.

FIG. 36 is a schematic perspective view of a direct type backlight unit 600 that is another example of a backlight unit which uses, as a light source, a light-emitting device including a phosphor according to an embodiment of the inventive concept.

The direct type backlight unit 600 includes a light diffusion plate 602, an LED light source module 610 disposed under the light diffusion plate 602, and a bottom case 620 that may accommodate the LED light source module 610.

The LED light source module 610 includes a printed circuit board 612 and a plurality of LED light sources 614 mounted on the upper surface of the printed circuit board 612. Each of the plurality of LED light sources 614 may include a light-emitting device including a phosphor according to an embodiment of the inventive concept.

Figure 37:
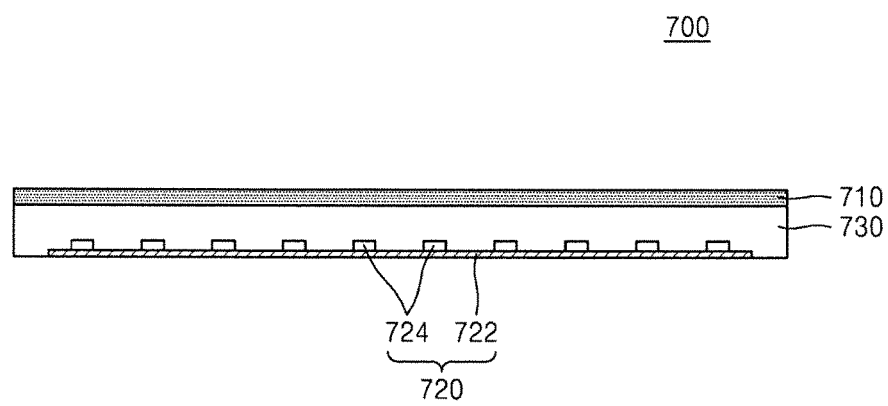
FIG. 37 is a schematic cross-sectional view of a direct type backlight unit including a phosphorescent film including a phosphor according to an embodiment of the inventive concept.
Figure 38:
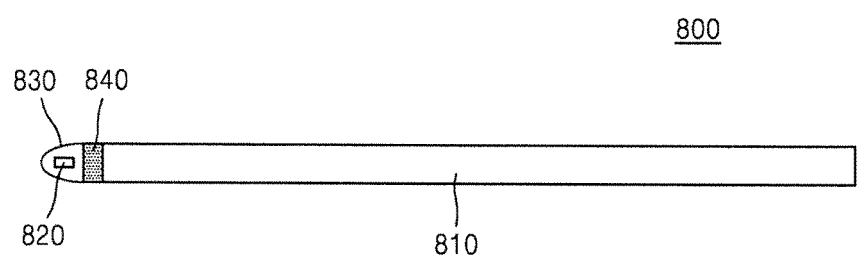
FIG. 38 is a schematic cross-sectional view of an edge-type backlight unit including a phosphorescent film including a phosphor according to an embodiment of the inventive concept.
Figure 39:
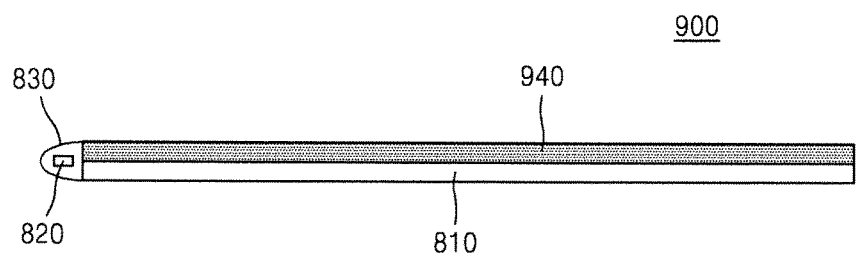
FIG. 39 is a schematic cross-sectional view of another edge-type backlight unit including a phosphorescent film including a phosphor according to an embodiment of the inventive concept.

FIGS. 37 through 39 are schematic sectional view of backlight units 700, 800, and 900 including a phosphor according to an embodiment of the inventive concept, in which the phosphor is disposed outside a package including an LED.

FIG. 37 is a schematic cross-sectional view of a direct type backlight unit 700 including a phosphorescent film including a phosphor according to an embodiment of the inventive concept.

The direct type backlight unit 700 includes a phosphorescent film 710 including a phosphor according to an embodiment of the inventive concept and an LED light source module 720 disposed under the phosphorescent film 710.

The direct type backlight unit 700 may include a bottom case 730 that may accommodate the LED light source module 720. The phosphorescent film 710 may be disposed on the bottom case 730, and at least some of light emitted from the LED light source module 720 may be wavelength-converted by the phosphorescent film 710.

In some embodiments, the phosphorescent film 710 may be provided in a form in which the phosphorescent film 710 is combined with a light diffusion plate in one body.

The LED light source module 720 may include a printed circuit board 722 and a plurality of LED light source 724 mounted on the upper surface of the printed circuit board 722.

FIG. 38 is a schematic cross-sectional view of an edge-type backlight unit 800 including a phosphorescent film including a phosphor according to an embodiment of the inventive concept.

The edge-type backlight unit 800 includes a light guiding panel 810 and an LED light source 820 that is disposed at one side of the light guiding panel 10. Light emitted from the LED light source 820 may be guided into the light guiding panel 810 by virtue of a reflective structure 830.

A phosphorescent film 840 is positioned between the side of the light guiding plate 810 and the LED light source 820. The phosphorescent film 840 includes a phosphor according to an embodiment of the inventive concept.

FIG. 39 is a schematic cross-sectional view of another edge-type backlight unit 900 including a phosphorescent film including a phosphor according to an embodiment of the inventive concept. The edge-type backlight unit 900 illustrated in FIG. 39 is similar to the edge-type backlight unit 800 illustrated in FIG. 38, except that a phosphorescent film 940 is formed on a light-emitting surface of the light guiding panel 810.

While the inventive concept has been particularly shown and described with reference to exemplary embodiments thereof, it will be understood that various changes in form and details may be made therein without departing from the spirit and scope of the following claims.

What is claimed is:

1. A yellow phosphor comprising:
a crystal formed of a compound that is represented by the following formula (1):

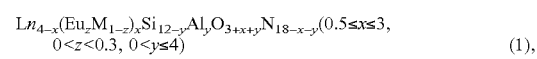

$$Ln_{4-x}(Eu_zM_{1-z})_xSi_{12-y}Al_yO_{3+x+y}N_{18-x-y}(0.5 \leq x \leq 3, 0 < z < 0.3, 0 < y \leq 4)$$ (1), wherein Ln comprises at least rare earth element, and M comprises at least one selected from calcium (Ca), barium (Ba), strontium (Sr), and magnesium (Mg).

2. The yellow phosphor of claim 1, wherein Ln comprises at least one selected from lanthanum (La) and Cerium (Ce).

3. The yellow phosphor of claim 1, wherein M includes at least calcium (Ca).

4. The yellow phosphor of claim 1, wherein the crystal is monoclinic and has a crystal structure of a space group C2.

5. The yellow phosphor of claim 1, wherein Ln comprises a combination in which at least 70 mol % of a total amount of Ln comprises Ce and La and a remainder of the total amount of Ln comprises at least one selected from lutetium (Lu), scandium (Sc), gadolinium (Gd), and yttrium (Y).

6. The yellow phosphor of claim 1, wherein Ln comprises at least one selected from La and Ce, and Ln further comprises at least one selected from a praseodymium ion ($Pr^{3+}$) and a terbium ion ($Tb^{3+}$).

7. The yellow phosphor of claim 1, wherein Ln comprises at least one selected from La and Ce, and Ln further comprises at least one selected from neodymium (Nd), promethium (Pm), samarium (Sm), dysprosium (Dy), holmium (Ho), erbium (Er), thulium (Tm), and ytterbium (Yb).

8. The yellow phosphor of claim 1, wherein M comprises a combination in which at least 90 mol % of a total amount of M comprises Ca and a remainder of the total amount of M comprises at least one selected from Sr, Ba, and Mg.

9. A light-emitting device including a structure combining the yellow phosphor of claim 1, a red phosphor, and a blue light-emitting diode (LED).

10. The light-emitting device of claim 9, wherein the red phosphor comprises at least one selected from the group of $CaAlSiN_3$:Eu, $Sr_2Si_5N_8$:Eu, $SrSiAl_4N_7$:Eu, $SrLiAl_3N_4$:Eu, and $K_2SiF_6$:$Mn^{4+}$.

11. The light-emitting device of claim 9, wherein the light-emitting device is configured to emit light of which (x, y) coordinates of a CIE 1931 colorimetric system are positioned on a line segment, which connects (0.4476, 0.4074), (0.3484, 0.3516), (0.3101, 0.3162), (0.3128, 0.3292), and (0.3333, 0.3333), or in an area surrounded by the line segment and a black-body radiation spectrum.

12. The light-emitting device of claim 9, wherein the light-emitting device is configured to emit light having a color temperature between 2,000K and 20,000K.

13. A light-emitting device comprising:
a light-emitting diode (LED) chip;
a resin covering at least a portion of the LED chip; and
a yellow phosphor dispersed in the resin,
wherein the yellow phosphor comprises a crystal formed of a compound that is represented by the following formula (1):

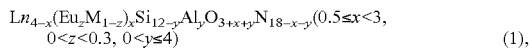
$Ln_{4-x}(Eu_zM_{1-z})_xSi_{12-y}Al_yO_{3+x+y}N_{18-x-y}$ (0.5≤x<3, 0<z<0.3, 0<y≤4)     (1), wherein Ln comprises at least one rare earth element, and M comprises at least one selected from calcium (Ca), barium (Ba), strontium (Sr), and magnesium (Mg).

14. The light-emitting device of claim 13, wherein Ln comprises at least one selected from lanthanum (La) and Cerium (Ce).

15. The light-emitting device of claim 13, wherein the crystal is monoclinic and has a crystal structure of a space group C2.

16. A light-emitting device comprising:
a light-emitting diode (LED) chip; and
a yellow phosphor disposed in a path of light emission from the LED chip, wherein the yellow phosphor comprises a crystal formed of a compound that is represented by the following formula (1):

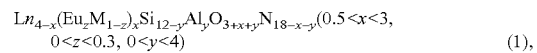
$Ln_{4-x}(Eu_zM_{1-z})_xSi_{12-y}Al_yO_{3+x+y}N_{18-x-y}$ (0.5<x<3, 0<z<0.3, 0<y<4)     (1), wherein Ln comprises at least one rare earth element, and M comprises at least one selected from calcium (Ca), barium (Ba), strontium (Sr), and magnesium (Mg).

17. The light-emitting device of claim 16, further comprising a lighting unit body including a reflective cup having the LED chip disposed therein and a resin disposed therein to encapsulate LED chip in the reflective cup, wherein the yellow phosphor is disposed between the LED chip and the resin, disposed on the resin or dispersed in the resin.

18. The light-emitting device of claim 16, wherein the light-emitting device is one of a bulb-type lamp including a socket structure, a rectification circuit; a headlamp; and a backlight unit.

19. The light-emitting device of claim 16, wherein the light-emitting device is a backlight unit in which the yellow phosphor is formed as part of a phosphorescent film, wherein the phosphorescent film is disposed on a bottom case of the backlight unit, disposed between the LED chip and a light guiding plate of the backlight unit, or disposed on a light-emitting surface of a light guiding panel of the backlight unit.

* * * * *